US012321092B2

(12) United States Patent
Kim et al.

(10) Patent No.: US 12,321,092 B2
(45) Date of Patent: Jun. 3, 2025

(54) PELLICLE FOR EXTREME ULTRAVIOLET LITHOGRAPHY CONTAINING AMORPHOUS CARBON AND METHOD FOR MANUFACTURING THE SAME

(71) Applicant: KOREA ELECTRONICS TECHNOLOGY INSTITUTE, Seongnam-si (KR)

(72) Inventors: Hyeong Keun Kim, Yongin-si (KR); Seul Gi Kim, Yongin-si (KR); Hyun Mi Kim, Seoul (KR); Jin Woo Cho, Seoul (KR); Hye Young Kim, Bucheon-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 598 days.

(21) Appl. No.: 17/698,370

(22) Filed: Mar. 18, 2022

(65) Prior Publication Data
US 2022/0326600 A1    Oct. 13, 2022

(30) Foreign Application Priority Data

Apr. 8, 2021 (KR) ........................ 10-2021-0045881

(51) Int. Cl.
*G03F 1/62* (2012.01)
(52) U.S. Cl.
CPC ..................... *G03F 1/62* (2013.01)
(58) Field of Classification Search
CPC ........................................ G03F 1/62
USPC .......................................... 430/5
See application file for complete search history.

(56) References Cited

U.S. PATENT DOCUMENTS 11,789,359 B2 * 10/2023 Kim ................ C01B 32/186
430/5
2020/0073230 A1    3/2020 Lin

FOREIGN PATENT DOCUMENTS

| KR | 10-2016-0133751 A | 11/2016 |
| KR | 10-2017-0029556 A | 3/2017 |
| KR | 10-1813186 B1 | 12/2017 |
| KR | 10-2018-0055211 A | 5/2018 |
| KR | 10-2018-0072786 A | 6/2018 |
| KR | 10-2018-0072844 A | 6/2018 |
| KR | 10-2018-0094084 A | 8/2018 |
| KR | 10-2018-0103505 A | 9/2018 |
| KR | 10-2018-0135490 A | 12/2018 |

OTHER PUBLICATIONS

Office Action dated Sep. 14, 2023 in Korean Application No. 10-2021-0045881.
Office Action issued in Korean Application No. 10-2021-0045881 dated May 30, 2024.
Notice of Allowance received in Korean Application No. 10-2021-0045881 dated Feb. 7, 2025.

* cited by examiner

*Primary Examiner* — Christopher G Young
(74) *Attorney, Agent, or Firm* — Knobbe, Martens, Olsen & Bear, LLP

(57) ABSTRACT

This application relates to a pellicle for extreme ultraviolet lithography containing amorphous carbon and a manufacturing method thereof. In one aspect, the pellicle includes a substrate having an opening formed in a central portion, a support layer formed on the substrate to cover the opening, and a pellicle layer formed on the support layer and containing amorphous carbon. The pellicle layer may include a core layer formed on the support layer, and a capping layer formed on the core layer and may further include a buffer layer. At least one of the core layer, the capping layer, or the buffer layer may be an amorphous carbon layer.

14 Claims, 18 Drawing Sheets

PELLICLE FOR EXTREME ULTRAVIOLET LITHOGRAPHY CONTAINING AMORPHOUS CARBON AND METHOD FOR MANUFACTURING THE SAME

CROSS-REFERENCE TO RELATED APPLICATION

The present application claims priority to Korean Patent Application No. 10-2021-0045881 filed on Apr. 8, 2021 in the Korean Intellectual Property Office, which is incorporated herein in its entirety by reference.

BACKGROUND

Technical Field

The present disclosure relates to a semiconductor lithography technology. More particularly, the present disclosure relates to a pellicle for extreme ultraviolet lithography containing amorphous carbon and installed in a mask used in a lithography process using extreme ultraviolet rays, and to a method for manufacturing the same.

Description of Related Technology

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of light. Extreme ultraviolet (EUV) lithography technology, recently developed as a next-generation technology, can realize a fine pattern through a single resist process.

SUMMARY

The present disclosure provides a pellicle for extreme ultraviolet lithography containing amorphous carbon having an extreme ultraviolet transmittance of 90% or more and a reflectance of 0.04% or less in an extreme ultraviolet output environment of 350 W or more, and provides a method for manufacturing the same.

In addition, the present disclosure provides a pellicle for extreme ultraviolet lithography containing amorphous carbon allowing a capping layer to be stably formed on a core layer formed of graphene, and provides a method for manufacturing the same.

In addition, the present disclosure provides a pellicle for extreme ultraviolet lithography containing amorphous carbon allowing the reflectance to be lowered without a significant change of the extreme ultraviolet transmittance, and provides a method for manufacturing the same.

According to embodiments of the present disclosure, a pellicle for extreme ultraviolet lithography may include a substrate having an opening formed in a central portion, a support layer formed on the substrate to cover the opening, and a pellicle layer formed on the support layer and containing amorphous carbon. The pellicle layer may include a core layer formed on the support layer, and a capping layer formed on the core layer and containing the amorphous carbon.

In the pellicle, when the capping layer is an amorphous carbon layer, a thickness may be 10 nm or less. In this case, a material of the core layer may include at least one of graphene, Me-$\alpha$ (Me is at least one of Zr and Mo, and $\alpha$ is at least one of nitride, boride, carbide, and silicide), $ZrSi_2$, $ZrB_x$ ($2 \leq x < 16$), $ZrB_xSi_y$ ($x \geq 2$, $y \geq 2$), and $YB_x$ ($x \geq 2$).

In the pellicle, the core layer may contain the amorphous carbon. In this case, when the core layer is an amorphous carbon layer, a thickness may be 30 nm or less.

In the pellicle, the pellicle layer may further include a buffer layer formed at least one of between the support layer and the core layer and between the core layer and the capping layer. In this case, the buffer layer may contain the amorphous carbon. In addition, a thickness of the buffer layer may be 7 nm or less. In addition, a material of the core layer may include at least one of graphene, Me-$\alpha$ (Me is at least one of Zr and Mo, and $\alpha$ is at least one of nitride, boride, carbide, and silicide), $ZrSi_2$, $ZrB_x$ ($2 \leq x < 16$), $ZrB_xSi_y$ ($x \geq 2$, $y \geq 2$), and $YB_x$ ($x \geq 2$).

In the pellicle, a density of the amorphous carbon may be 1.4 to 1.8 $g/cm^3$.

According to embodiments of the present disclosure, a method for manufacturing a pellicle for extreme ultraviolet lithography may include forming a support layer on a substrate, forming a pellicle layer containing amorphous carbon on the support layer, and forming an opening by removing a central portion of the substrate under the support layer to expose the support layer. Forming the pellicle layer may include forming a core layer on the support layer, and forming a capping layer containing the amorphous carbon on the core layer.

In the method, forming the pellicle layer may further include forming a buffer layer containing amorphous carbon on the core layer before forming the capping layer on the core layer.

In the method, forming the pellicle layer may further include forming a first buffer layer on the support layer before forming the core layer on the support layer, and forming a second buffer layer on the core layer before forming the capping layer on the core layer. In this case, at least one of the first and second buffer layers may contain amorphous carbon.

According to the present disclosure, the pellicle for extreme ultraviolet lithography in which the amorphous carbon is applied to the pellicle layer can provide an extreme ultraviolet transmittance of 90% or more and a reflectance of 0.04% or less in an extreme ultraviolet output environment of 350 W or more. That is, when at least one of the core layer, the buffer layer, and the capping layer is formed with the amorphous carbon layer, the pellicle layer can provide an extreme ultraviolet transmittance of 90% or more and a reflectance of 0.04% or less in an extreme ultraviolet output environment of 350 W or more by significantly lowering the reflectance without significantly changing the extreme ultraviolet transmittance.

Using the amorphous carbon as the material of the buffer layer can significantly reduce the extreme ultraviolet reflectance of the pellicle having a stacked structure of the core layer and the capping layer of various materials.

If the buffer layer is formed with an amorphous carbon layer of 5 nm or less when the thickness of the core layer is 10 to 15 nm, the pellicle can provide an extreme ultraviolet transmittance of 90% or more and a reflectance of 0.04% or less in an extreme ultraviolet output environment of 350 W or more even if the capping layer is formed to have a wide thickness range of 10 nm or less.

Typically forming the core layer with graphene causes a problem in that it is difficult to directly form the capping layer on the core layer due to the sp2 bonding structure of graphene. However, when the buffer layer interposed between the core layer and the capping layer is formed with an amorphous carbon layer as in the present disclosure, it is possible to stably form the capping layer on the core layer of the graphene material because the amorphous carbon layer functions as a seed of the capping layer.

When amorphous carbon is used as the material of the core layer, the pellicle is capable of providing an extreme ultraviolet transmittance of 90% or more and a reflectance of 0.04% or less in an extreme ultraviolet output environment of 350 W or more even if the capping layer made of $SiN_x$ material is present on or under the core layer.

In addition, because amorphous carbon can be easily formed through a typical deposition process or a typical solution process, using amorphous carbon as the material of the core layer can simplify the manufacturing process of the core layer than using graphene or a multi-component material.

When amorphous carbon is used as the material of the capping layer and the carbon-based core layer such as graphene is formed, it is possible to provide a chemically and mechanically stable pellicle because the coefficient of thermal expansion is similar between the capping layer and the core layer.

When the pellicle layer is formed by sputtering amorphous carbon, it is possible to easily control the density of the amorphous carbon by regulating plasma power or working pressure. Through the density control of the amorphous carbon, it is possible to adjust the refractive index of the pellicle layer containing the amorphous carbon. That is, by controlling the density of the amorphous carbon, it is possible to adjust the extreme ultraviolet transmittance and reflectance of the pellicle.

DETAILED DESCRIPTION

Figure 1:
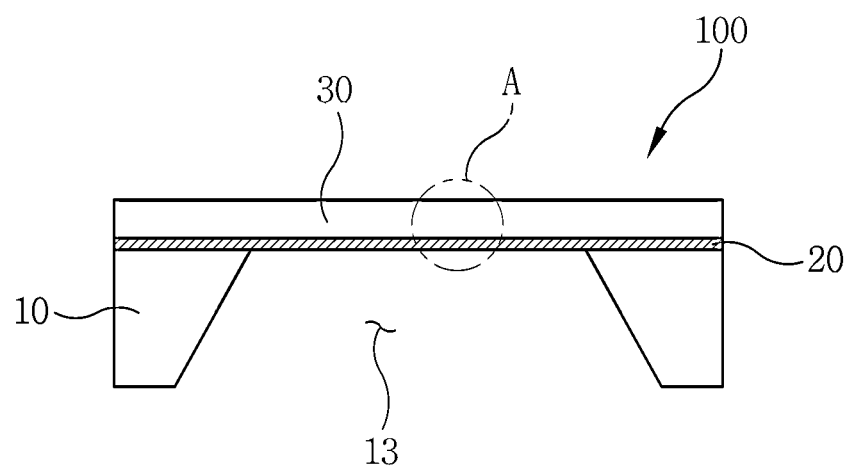
FIG. 1 is a cross-sectional view showing a pellicle for extreme ultraviolet lithography containing amorphous carbon according to a first embodiment of the present disclosure.

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography machine.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 90% or more is required in order to minimize deterioration of productivity due to loss of a light source. In addition, mechanical stability that the pellicle is not damaged by physical movement up to 20G inside the extreme ultraviolet lithography apparatus, and thermal stability that the pellicle can withstand a thermal load of 250 W or more based on a 5 nm node are required. Also, chemical durability that the pellicle does not react to hydrogen radicals generated in an extreme ultraviolet environment is required.

Currently, pellicle development companies are developing transmissive materials based on polycrystalline silicon (p-Si) or SiN. However, such materials do not satisfy a transmittance of 90% or more, which is the most important condition of a pellicle for extreme ultraviolet lithography. Also, such materials have weaknesses in thermal stability, mechanical stability, and chemical durability in an extreme ultraviolet lithography environment, so that process development research is being conducted to supplement their properties. For example, materials such as Mo, Ru, and Zr have been selected and studied as materials for solving the problems of SiN-based materials, but it is difficult to manufacture a thin film and maintain its shape.

In order to address the above-discussed issue, a graphene-based pellicle for extreme ultraviolet lithography has been introduced. Graphene has a transmittance of 90% or more for extreme ultraviolet rays. In addition, graphene has very high tensile strength when base planes are uniformly arranged in the areal direction, so it can satisfy all characteristic indicators such as high transmittance, thermal stability, and mechanical stability.

However, because graphene has an sp2 bonding structure, it is difficult to stably form a capping layer on a core layer formed of graphene.

In addition, a conventional pellicle suffers from a problem in that extreme ultraviolet transmittance and reflectance vary greatly depending on the thicknesses of the core layer and the capping layer, and it is difficult to control the process conditions for adjusting the thicknesses of the core layer and the capping layer.

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

First Embodiment

Figure 2:
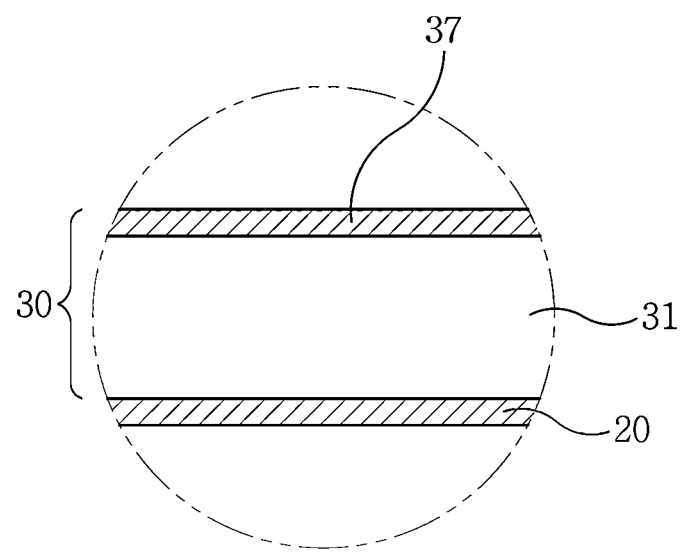
FIG. 2 is an enlarged view of part A of FIG. 1.

FIG. 1 is a cross-sectional view showing a pellicle for extreme ultraviolet lithography containing amorphous carbon according to a first embodiment of the present disclosure. FIG. 2 is an enlarged view of part A of FIG. 1.

Referring to FIGS. 1 and 2, a pellicle 100 for extreme ultraviolet lithography according to the first embodiment (hereinafter referred to as 'pellicle') includes a silicon substrate 10 having an opening 13 formed in its central portion, a support layer 20 formed on the silicon substrate 10 so as to cover the opening 13, and a pellicle layer 30 containing amorphous carbon formed on the support layer 20. The pellicle layer 30 includes a core layer 31 and a capping layer 37 that are sequentially stacked on the support layer 20.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the present disclosure will be described in detail.

The silicon substrate 10 supports the core layer 20 and the capping layer 30 and makes it easy to handle and transport the pellicle 100 during and after the process of manufacturing the pellicle 100. The silicon substrate 10 may be formed of a material available for an etching process.

The support layer 20 serving as an etch stopper is formed on the silicon substrate 10. The pellicle layer 30 is formed on the support layer 20.

The support layer 20 is formed of a material having resistance to KOH, and also functions to prevent the material of the pellicle layer 30 from being diffused into the silicon substrate 10. The material of the support layer 20 may include at least one of $SiN_x$, $SiO_2$, SiC, and $Mo_2C$. Here, $SiN_x$ may include $Si_3N_4$. The support layer 20 may be formed by a chemical vapor deposition (CVD) process, but it is formed by an atomic layer deposition (ALD), e-beam evaporation, or sputtering process so as to have the best transmittance and minimize defects through free control of thickness, physical properties, and chemical composition. The support layer 20 may be formed on the silicon substrate 10 to have a thickness of 1 nm to 10 nm. The support layer 20 may be formed to have a thickness corresponding to the capping layer 37.

The opening 13 in the central portion of the silicon substrate 10 may be formed using a micro-machining technique such as micro-electro mechanical systems (MEMS). That is, the opening 13 is formed by removing the central portion of the silicon substrate 10 under the support layer 20 by means of the micro-machining technique. The opening 13 partially exposes the etch stopper 20 under the pellicle layer 30.

The pellicle layer 30 includes the core layer 31 and the capping layer 37. At least one of the core layer 31 and the capping layer 37 contains amorphous carbon.

The core layer 31 is a layer that determines the transmittance of extreme ultraviolet rays. The core layer 31 has a transmittance of 90% or more for extreme ultraviolet rays, and effectively dissipates heat to prevent overheating of the pellicle layer 30.

The capping layer 37 provides thermal stability, mechanical stability, and chemical durability to the pellicle layer 30 while minimizing a decrease in the transmittance of the core layer 31 for extreme ultraviolet rays. Specifically, the capping layer 37 is a protective layer for the core layer 31 and provides thermal stability by effectively dissipating heat generated in the core layer 31 to the outside. In addition, the capping layer 37 provides mechanical stability by supplementing the mechanical strength of the core layer 31. In addition, the capping layer 37 provides chemical durability by protecting the core layer 31 from hydrogen radicals and oxidation.

First, the core layer 31 may be formed with an amorphous carbon layer that contains amorphous carbon. The core layer 31 formed with the amorphous carbon layer may have a thickness of 30 nm or less.

With respect to the core layer 31 formed with the amorphous carbon layer, the material of the capping layer 37 may include at least one of nitride, oxide, boride, carbide, and silicide. Here, the nitride may include $SiN_x$, SiON, BN, or BCN. The oxide may include $SiO_2$. The boride may include $ZrB_x$ (2≤x<16), $ZrB_xSi_y$ (x≥2, y≥2), $YB_x$ (x≥2), or $SiB_6$. The carbide may include SiC, $Mo_2C$, or $B_4C$. The silicide may include $ZrSi_x$ (x≥2).

As such, when amorphous carbon is used as the material of the core layer 31, the pellicle 100 is capable of providing an extreme ultraviolet transmittance of 90% or more and a reflectance of 0.04% or less in an extreme ultraviolet output environment of 350 W or more even if the capping layer 37 made of $SiN_x$ material is present on the core layer 31.

In addition, because amorphous carbon can be easily formed through a typical deposition process or a typical solution process, using amorphous carbon as the material of the core layer 31 can simplify the manufacturing process of the core layer 31 than using graphene or a multi-component material.

Next, the capping layer 37 may be formed with an amorphous carbon layer that contains amorphous carbon. The capping layer 37 formed with the amorphous carbon layer may have a thickness of 10 nm or less.

With respect to the capping layer 37 formed with the amorphous carbon layer, the material of the core layer 31 may include at least one of graphene, Me-α (Me is at least one of Zr and Mo, and α is at least one of nitride, boride, carbide, and silicide), $ZrSi_2$, $ZrB_x$ (2≤x<16), $ZrB_xSi_y$ (x≥2, y≥2), and $YB_x$ (x≥2).

When the core layer 31 is formed of graphene, it may be formed by a transfer method or a direct growth method.

The transfer method is a method of forming the core layer 31 by transferring graphene grown on a separate substrate onto the support layer 20 of the silicon substrate 10.

The direct growth method is a method of directly growing graphene on the support layer 20 of the silicon substrate 10 by using interlayer exchange between a metal catalyst layer and a source layer of an amorphous carbon material through heat treatment. Of course, the metal catalyst layer is removed after the graphene is directly grown. A seed layer may be formed on the support layer 20 so that graphene, which is directly grown through interlayer exchange, can be stably bonded on the support layer 20. As the seed layer, at least one of an amorphous carbon layer formed to a thickness of 5 nm or less, few-layer graphene, amorphous boron, BN, BCN, $B_4C$, and Me-X (Me is at least one of Si, Ti, Mo, and Zr, and X is at least one of B, C, and N) may be used.

As such, when amorphous carbon is used as the material of the capping layer 37 and the carbon-based core layer 31 such as graphene is formed, it is possible to provide a chemically and mechanically stable pellicle 100 because the coefficient of thermal expansion is similar between the capping layer 37 and the core layer 31.

When amorphous carbon contained in the pellicle layer 30 is formed by means of sputtering, it is possible to easily control the density of the amorphous carbon by regulating plasma power or working pressure. Through the density control of the amorphous carbon, it is possible to adjust the refractive index of the pellicle layer containing the amorphous carbon. That is, by controlling the density of the amorphous carbon, it is possible to adjust the extreme ultraviolet transmittance and reflectance of the pellicle 100. For example, when the plasma power is applied to 300 W or less, the density of the amorphous carbon may be 1.4 to 2.2 g/cm$^3$. The plasma power and the density of the amorphous carbon have an inverse relationship. In order to form the thickness of the amorphous carbon layer to 30 nm or less, the density of the amorphous carbon layer may be controlled to 1.4 to 1.8 g/cm$^3$.

As such, the pellicle 100 according to the first embodiment in which the amorphous carbon is applied to the pellicle layer 30 can provide an extreme ultraviolet transmittance of 90% or more and a reflectance of 0.04% or less in an extreme ultraviolet output environment of 350 W or more. That is, when at least one of the core layer 31 and the capping layer 37 is formed with the amorphous carbon layer, the pellicle layer 30 can provide an extreme ultraviolet transmittance of 90% or more and a reflectance of 0.04% or less in an extreme ultraviolet output environment of 350 W or more by significantly lowering the reflectance without significantly changing the extreme ultraviolet transmittance.

The above-described pellicle 100 according to the first embodiment may be manufactured by the following manufacturing process. First, the support layer 20, the core layer 31, and the capping layer 37 are sequentially stacked on the silicon substrate 10 in which the opening 13 is not formed.

At this time, the support layer 20 may be formed by a CVD process, but it is formed by an ALD, e-beam deposition, or sputtering process so as to have the best transmittance and minimize defects through free control of thickness, physical properties, and chemical composition. The material of the support layer 20 may include at least one of $SiN_x$, $SiO_2$, SiC, and $Mo_2C$. For example, the support layer 20 may be formed of $Si_3N_4$ included in $SiN_x$.

The core layer 31 and the capping layer 37 may be formed using various deposition methods such as sputtering, CVD, and ALD. The amorphous carbon contained in the pellicle layer 30 may be formed by sputtering.

Then, by removing the central portion of the silicon substrate 10 under the core layer 31 to form the opening 13 through which the core layer 31 is exposed, the pellicle 100 according to the first embodiment can be obtained. That is, the opening 13 is formed by removing the central portion of the silicon substrate 10 under the support layer 20 through wet etching. The opening 13 exposes the support layer 20 under the core layer 31.

Second Embodiment

Figure 3:
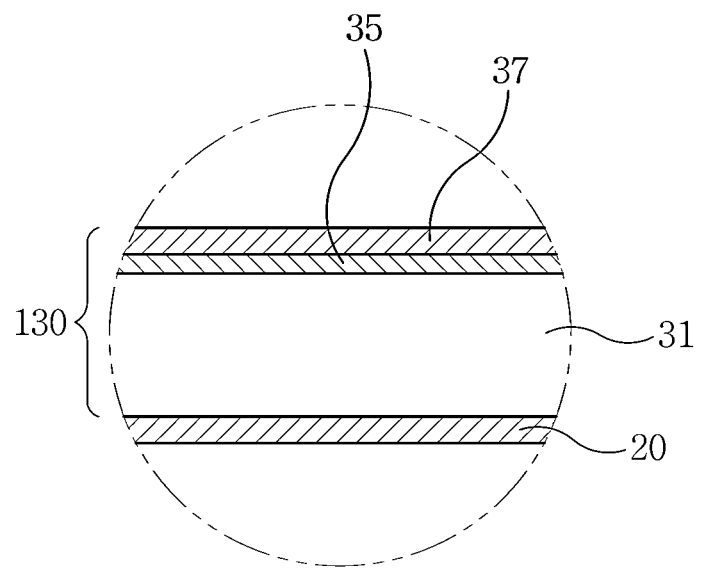
FIG. 3 is an enlarged view showing a pellicle for extreme ultraviolet lithography containing amorphous carbon according to a second embodiment of the present disclosure.

FIG. 3 is an enlarged view showing a pellicle for extreme ultraviolet lithography containing amorphous carbon according to a second embodiment of the present disclosure.

Referring to FIG. 3, the pellicle according to the second embodiment includes the silicon substrate having the opening formed in the central portion, the support layer 20 formed on the silicon substrate to cover the opening, and a pellicle layer 130 containing amorphous carbon formed on the support layer 20. The pellicle layer 130 includes the core layer 31, a buffer layer 35, and the capping layer 37 that are sequentially stacked on the support layer 20.

In the pellicle layer 130 according to the second embodiment, the buffer layer 35 may be formed with an amorphous carbon layer that contains amorphous carbon. The buffer layer 35 formed with the amorphous carbon layer may have a thickness of 5 nm or less.

Using the amorphous carbon as the material of the buffer layer 35 can significantly reduce the extreme ultraviolet reflectance of the pellicle according to the second embodiment having a stacked structure of the core layer 31 and the capping layer 37 of various materials.

With respect to the buffer layer 35 formed with the amorphous carbon layer, the material of the capping layer 37 may include at least one of nitride, oxide, boride, carbide, and silicide. The material of the core layer 31 may include at least one of graphene, Me-α (Me is at least one of Zr and Mo, and α is at least one of nitride, boride, carbide, and silicide), $ZrSi_2$, $ZrB_x$ (2≤x<16), $ZrB_xSi_y$ (x≥2, y≥2), and $YB_x$ (x≥2).

If the buffer layer 35 is formed with an amorphous carbon layer of 5 nm or less when the thickness of the core layer 31 is 10 to 15 nm, the pellicle according to the second embodiment can provide an extreme ultraviolet transmittance of 90% or more and a reflectance of 0.04% or less in an extreme ultraviolet output environment of 350 W or more even if the capping layer 37 is formed to have a wide thickness range of 10 nm or less.

Typically forming the core layer with graphene causes a problem in that it is difficult to directly form the capping layer on the core layer due to the sp2 bonding structure of graphene. However, when the buffer layer 35 interposed between the core layer 31 and the capping layer 37 is formed with an amorphous carbon layer as in the second embodiment, it is possible to stably form the capping layer 37 on the core layer 31 of the graphene material because the amorphous carbon layer functions as a seed of the capping layer 37.

Meanwhile, although in the pellicle layer 130 according to the second embodiment an example in which the buffer layer 35 contains amorphous carbon is described, this is not construed as a limitation.

Alternatively or additionally, in the pellicle layer 130 according to the second embodiment, at least one of the core layer 31 and the capping layer 37 may contain amorphous carbon as in the first embodiment. When the core layer 31 or the capping layer 37 is formed with the amorphous carbon layer, the material of the buffer layer 35 may include B, C, Zr, $ZrSi_x$ (x≤2), $ZrC_x$ (0.8≤x≤1.2), $ZrB_x$ (2<x<16), $ZrB_xSi_y$ (x≥2, y≥2), $ZrC_xB_y$ (0.8≤x≤1.2, y≥2), or $ZrC_xSi$ (0.8≤x≤1.2, y≤2). Here, C among the materials of the buffer layer 35 may include graphene, SiC, or the like.

The above-described pellicle according to the second embodiment may be manufactured by the following manufacturing process. First, the support layer 20, the core layer 31, the buffer layer 35, and the capping layer 37 are sequentially stacked on the silicon substrate in which the opening is not formed.

At this time, the support layer 20 may be formed by a CVD process, but it is formed by an ALD, e-beam deposition, or sputtering process so as to have the best transmittance and minimize defects through free control of thickness, physical properties, and chemical composition. The material of the support layer 20 may include at least one of $SiN_x$, $SiO_2$, SiC, and $Mo_2C$. For example, the support layer 20 may be formed of $Si_3N_4$ included in $SiN_x$.

The core layer 31, the buffer layer 35, and the capping layer 37 may be formed using various deposition methods such as sputtering, CVD, and ALD. The amorphous carbon contained in the pellicle layer 130 may be formed by sputtering.

Then, by removing the central portion of the silicon substrate 10 under the core layer 31 to form the opening 13 through which the core layer 31 is exposed, the pellicle according to the second embodiment can be obtained. That is, the opening 13 is formed by removing the central portion of the silicon substrate 10 under the support layer 20 through wet etching. The opening 13 exposes the support layer 20 under the core layer 31.

Third Embodiment

Figure 4:
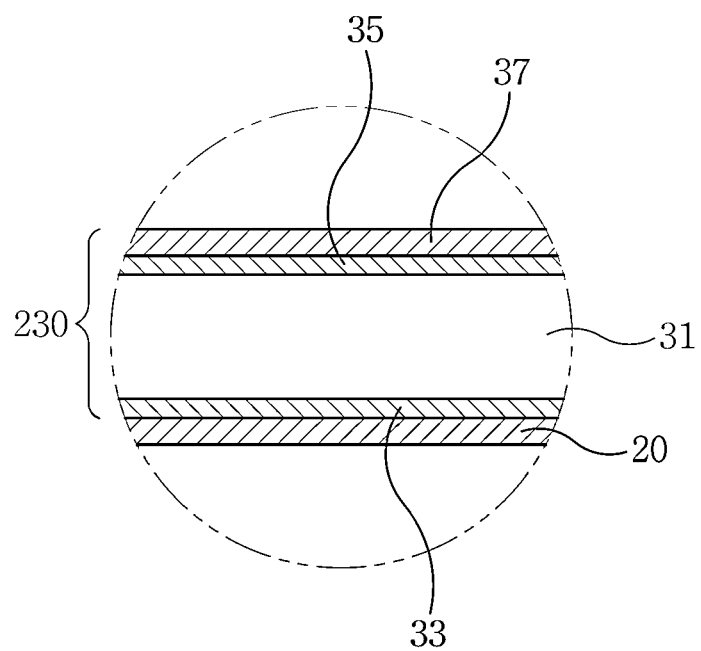
FIG. 4 is an enlarged view showing a pellicle for extreme ultraviolet lithography containing amorphous carbon according to a third embodiment of the present disclosure.

FIG. 4 is an enlarged view showing a pellicle for extreme ultraviolet lithography containing amorphous carbon according to a third embodiment of the present disclosure.

Referring to FIG. 4, the pellicle according to the third embodiment includes the silicon substrate having the opening formed in the central portion, the support layer 20 formed on the silicon substrate to cover the opening, and a pellicle layer 230 containing amorphous carbon formed on the support layer 20. The pellicle layer 230 includes a first buffer layer 33, the core layer 31, a second buffer layer 35, and the capping layer 37 that are sequentially stacked on the support layer 20.

In the pellicle layer 230 according to the third embodiment, each of the first and second buffer layers 33 and 35 may be formed with an amorphous carbon layer that contains amorphous carbon. Each of the first and second buffer layers 33 and 35 formed with the amorphous carbon layer may have a thickness of 5 nm or less.

Using the amorphous carbon as the materials of the first and second buffer layers 33 and 35 can significantly reduce the extreme ultraviolet reflectance of the pellicle according to the third embodiment having a stacked structure of the core layer 31 and the capping layer 37 of various materials.

With respect to the first and second buffer layers 33 and 35 formed with the amorphous carbon layer, the material of the capping layer 37 may include at least one of nitride, oxide, boride, carbide, and silicide. The material of the core layer 31 may include at least one of graphene, Me-α (Me is at least one of Zr and Mo, and α is at least one of nitride, boride, carbide, and silicide), $ZrSi_2$, $ZrB_x$ (2≤x<16), $ZrB_xSi_y$ (x≥2, y≥2), and $YB_x$ (x≥2).

If each of the first and second buffer layers 33 and 35 is formed with an amorphous carbon layer of 5 nm or less when the thickness of the core layer 31 is 10 to 15 nm, the pellicle according to the third embodiment can provide an extreme ultraviolet transmittance of 90% or more and a reflectance of 0.04% or less in an extreme ultraviolet output environment of 350 W or more even if the capping layer 37 is formed to have a wide thickness range of 10 nm or less.

Typically forming the core layer with graphene causes a problem in that it is difficult to directly form the capping layer on the core layer due to the sp2 bonding structure of graphene. However, when the second buffer layer 35 interposed between the core layer 31 and the capping layer 37 is formed with an amorphous carbon layer as in the third embodiment, it is possible to stably form the capping layer 37 on the core layer 31 of the graphene material because the amorphous carbon layer functions as a seed of the capping layer 37.

Meanwhile, although in the pellicle layer 230 according to the third embodiment an example in which the first and second buffer layers 33 and 35 contain amorphous carbon is described, this is not construed as a limitation.

For example, the first or second buffer layer 33 or 35 may contain amorphous carbon.

Alternatively or additionally, in the pellicle layer 230, at least one of the core layer 31 and the capping layer 37 may contain amorphous carbon as in the first embodiment. When the core layer 31 or the capping layer 37 is formed with the amorphous carbon layer, the material of the first and second buffer layers 33 and 35 may include B, C, Zr, $ZrSi_x$ (x≤2), $ZrC_x$ (0.8≤x≤1.2), $ZrB_x$ (2<x<16), $ZrB_xSi_y$ (x≥2, y≥2), $ZrC_xB_y$ y≥2), or $ZrC_xSi$ (0.8≤x≤1.2, y≤2). Here, C among the materials of the first and second buffer layers 33 and 35 may include graphene, SiC, or the like.

The above-described pellicle according to the third embodiment may be manufactured by the following manufacturing process. First, the support layer 20, the first buffer layer 33, the core layer 31, the second buffer layer 35, and the capping layer 37 are sequentially stacked on the silicon substrate in which the opening is not formed.

At this time, the support layer 20 may be formed by a CVD process, but it is formed by an ALD, e-beam deposition, or sputtering process so as to have the best transmittance and minimize defects through free control of thickness, physical properties, and chemical composition. The material of the support layer 20 may include at least one of $SiN_x$, $SiO_2$, SiC, and $Mo_2C$. For example, the support layer 20 may be formed of $Si_3N_4$ included in $SiN_x$.

The first buffer layer 33, the core layer 31, the second buffer layer 35, and the capping layer 37 may be formed using various deposition methods such as sputtering, CVD, and ALD. The amorphous carbon contained in the pellicle layer 230 may be formed by sputtering.

Then, by removing the central portion of the silicon substrate 10 under the core layer 31 to form the opening 13 through which the core layer 31 is exposed, the pellicle according to the third embodiment can be obtained. That is, the opening 13 is formed by removing the central portion of the silicon substrate 10 under the support layer 20 through wet etching. The opening 13 exposes the support layer 20 under the core layer 31.

Experimental Example

The density of the amorphous carbon contained in the pellicle layer according to the present disclosure may be controlled depending on the deposition conditions of sputtering, and thus the extreme ultraviolet transmittance and reflectance of the pellicle may be adjusted. That is, by regulating the plasma power or working pressure when forming the pellicle layer by depositing amorphous carbon through sputtering, it is possible to easily control the density of the amorphous carbon and thus adjust the refractive index of the pellicle layer containing the amorphous carbon. As such, by controlling the density of the amorphous carbon, it is possible to adjust the extreme ultraviolet transmittance and reflectance of the pellicle.

Figures 5, 6:
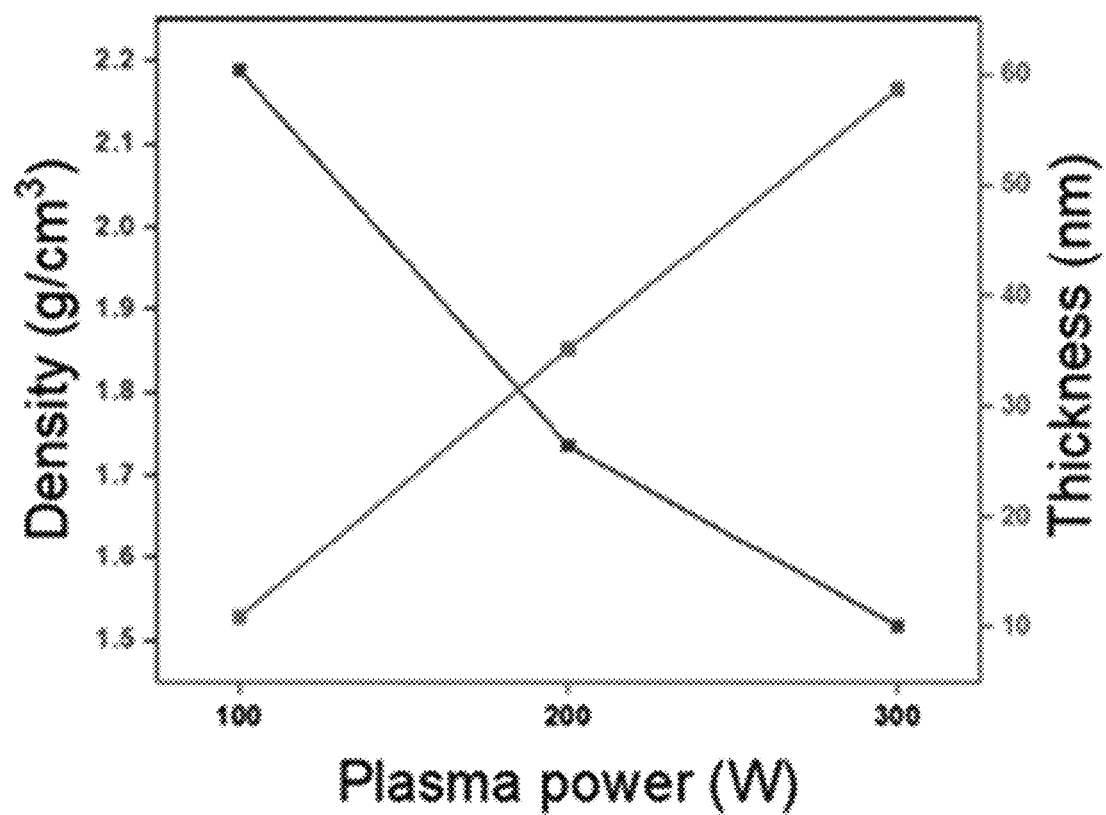
FIG. 5 is a photograph showing a surface image of amorphous carbon according to deposition conditions of the amorphous carbon.
FIG. 6 is a graph showing a change in density of amorphous carbon according to deposition conditions of the amorphous carbon.

FIG. 5 is a photograph showing a surface image of amorphous carbon according to deposition conditions of the amorphous carbon. FIG. 6 is a graph showing a change in density of amorphous carbon according to deposition conditions of the amorphous carbon. The density of amorphous carbon was measured using an X-ray reflectometer (XRR).

FIGS. 5 and 6 show changes in density and thickness of amorphous carbon according to the intensity of plasma power.

Referring to FIG. 5, it can be seen that as the plasma power increases, a surface color of amorphous carbon becomes pale from blue to yellow-green. That is, it can be seen that the density of amorphous carbon decreases as the plasma power increases.

Referring to FIG. 6, as a result of XRR measurement, the density of amorphous carbon may be 1.4 to 2.2 g/cm$^3$ when the plasma power is applied to 300 W or less.

When the plasma power is 100 W, the density of amorphous carbon is 2.2 g/cm$^3$. When the plasma power is 300 W, the density of amorphous carbon is 1.5 g/cm$^3$. That is, plasma power and the density of amorphous carbon have an inverse relationship.

In order to form the thickness of the amorphous carbon layer to 30 nm or less, a plasma power of 200 W or more is applied such that the deposited amorphous carbon layer has a density of 1.4 to 1.8 g/cm$^3$.

In order to check the transmittance and reflectance of the pellicle according to the present disclosure in an extreme ultraviolet output environment of 350 W or more, simulations were performed on the pellicles according to first to ninth experimental examples as shown in FIGS. 7 to 21. In these simulations, the transmittance and reflectance of the pellicle according to the first to ninth experimental examples were investigated in an extreme ultraviolet output environment of 350 W while changing the thickness of the core layer to 0 to 30 nm and the thickness of the capping layer to 0 to 10 nm.

First to Third Experimental Examples

Figure 7:
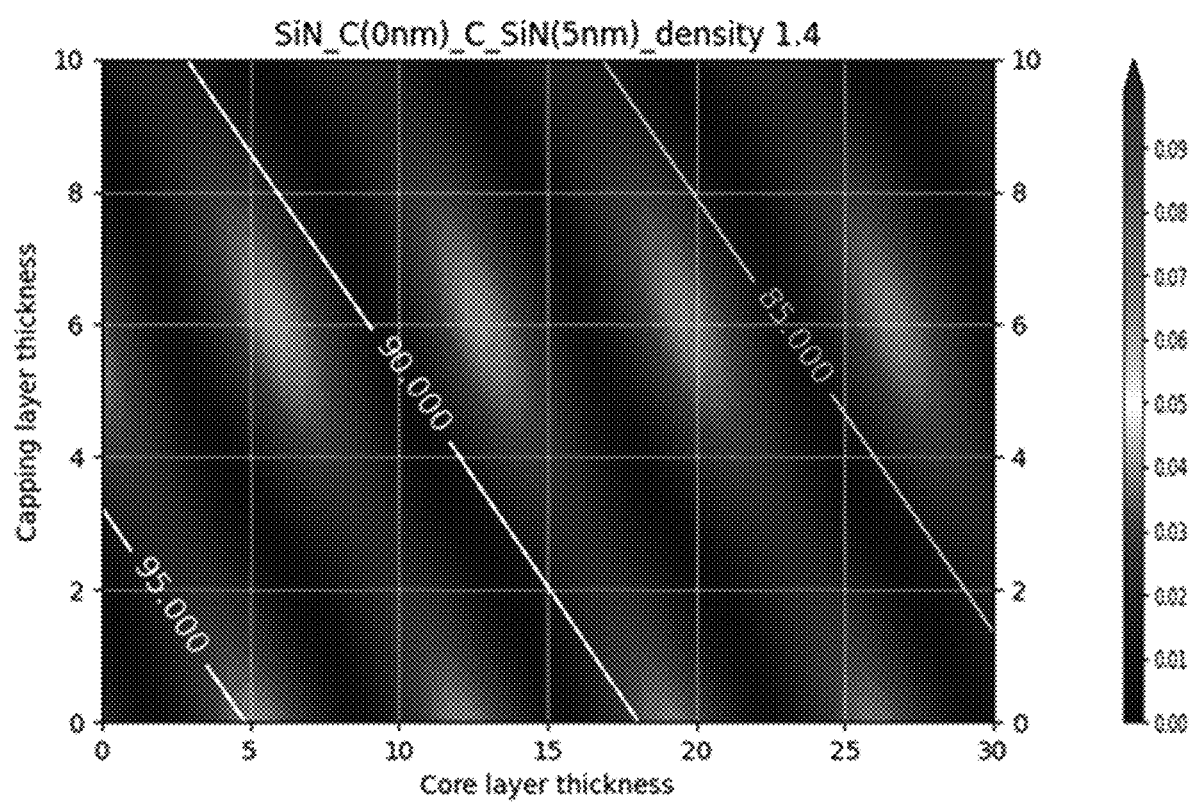
FIGS. 7 to 9 are graphs showing transmittance and reflectance of pellicles for extreme ultraviolet lithography according to first to third experimental examples in which a core layer is an amorphous carbon layer.
Figure 8:
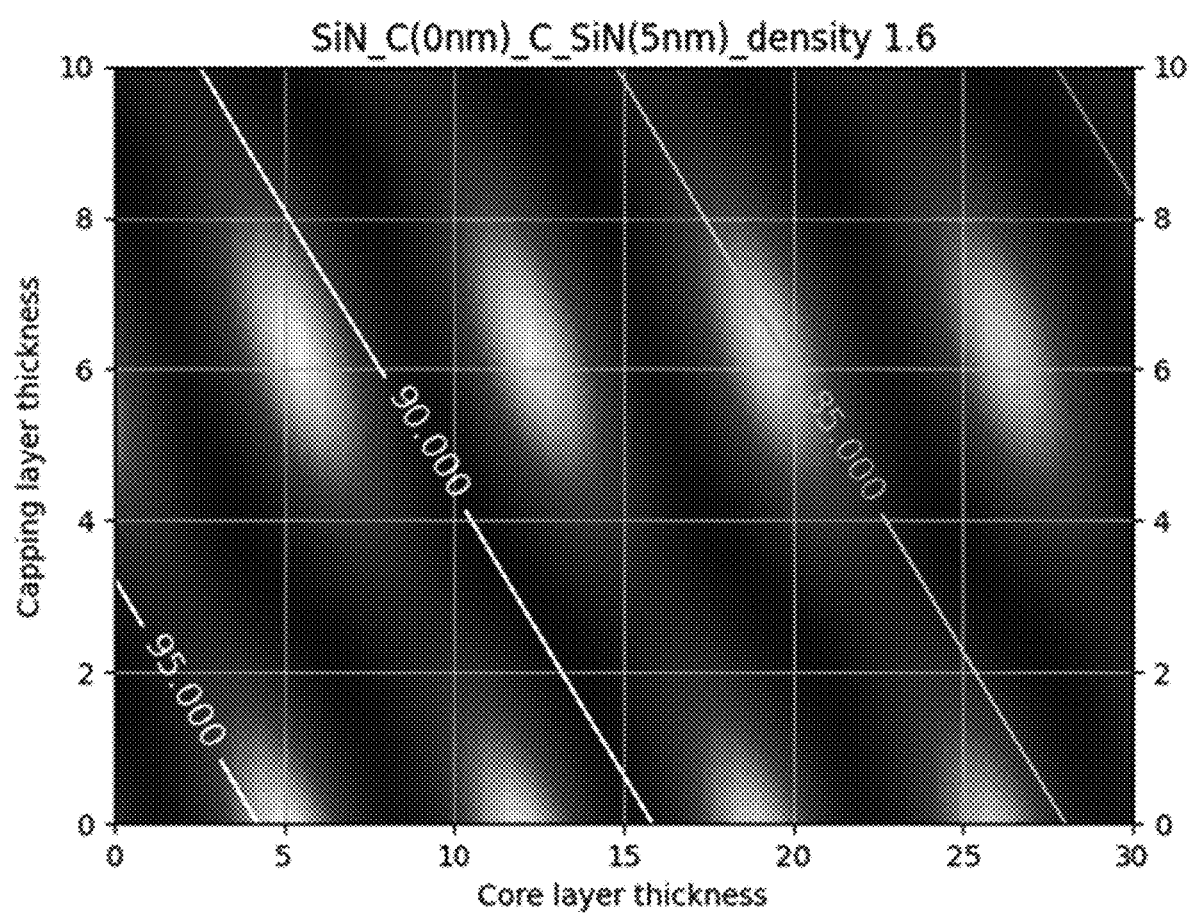
Figure 9:
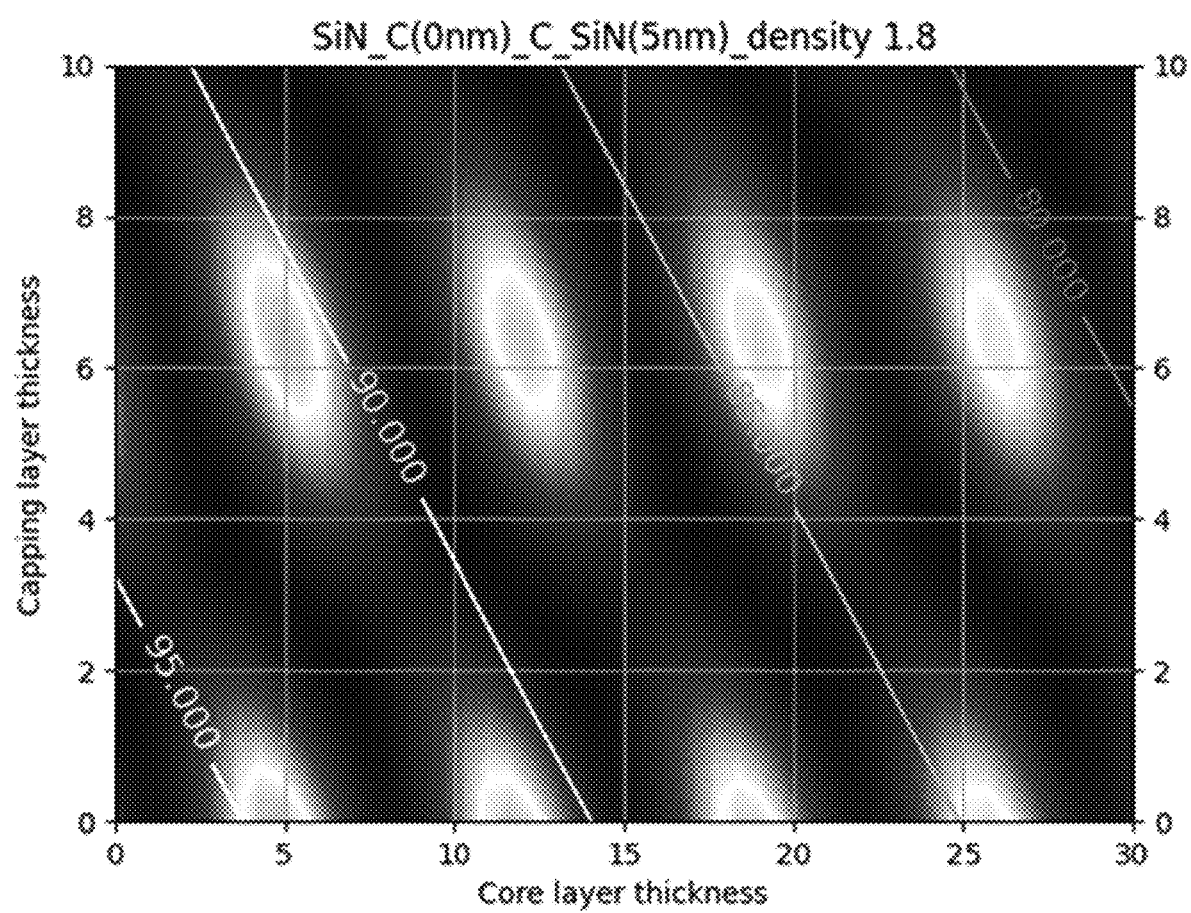

FIGS. 7 to 9 are graphs showing transmittance and reflectance of pellicles for extreme ultraviolet lithography according to first to third experimental examples in which a core layer is an amorphous carbon layer.

First Experimental Example

FIG. 7 is a graph showing transmittance and reflectance of a pellicle according to the first experimental example.

Referring to FIG. 7, the pellicle layer of the pellicle according to the first experimental example includes the support layer, the core layer, and the capping layer. The materials of the support layer and the capping layer are SiN$_x$. The material of the core layer is amorphous carbon, and the density of the amorphous carbon is 1.4 g/cm$^3$.

The pellicle layer according to the first experimental example is expressed as "SiN_C(0 nm)_C_SiN(5 nm)_density 1.4". Here, 'SiN' is the capping layer, 'C(0 nm)' is the buffer layer, 'C' is the core layer, and 'SiN(5 nm)' is the support layer. Also, 'density 1.4' is the density of amorphous carbon. In this example, 'C(0 nm)' indicates that there is no buffer layer.

When the thickness of the capping layer is 10 nm or less and the thickness of the core layer is 30 nm or less, the transmittance is 85% or more. When the thickness of the capping layer is 10 nm or less and the thickness of the core layer is 18 nm or less, the transmittance is 90% or more.

In addition, when the thickness of the capping layer is 1 to 4 nm or 6 to 10 nm and the thickness of the core layer is 30 nm or less, the reflectance is 0.04% or less.

Second Experimental Example

FIG. 8 is a graph showing transmittance and reflectance of a pellicle according to the second experimental example.

Referring to FIG. 8, the pellicle layer of the pellicle according to the second experimental example includes the support layer, the core layer, and the capping layer. The materials of the support layer and the capping layer are SiN$_x$. The material of the core layer is amorphous carbon, and the density of the amorphous carbon is 1.6 g/cm$^3$.

The pellicle layer according to the second experimental example is expressed as "SiN_C(0 nm)_C_SiN(5 nm)_density 1.6". Here, 'SiN' is the capping layer, 'C' is the core layer, and 'SiN(5 nm)' is the support layer. Also, 'density 1.6' is the density of amorphous carbon.

When the thickness of the capping layer is 10 nm or less and the thickness of the core layer is 28 nm or less, the transmittance is 85% or more. When the thickness of the capping layer is 10 nm or less and the thickness of the core layer is 16 nm or less, the transmittance is 90% or more.

In addition, when the thickness of the capping layer is 1 to 4 nm or 8 to 10 nm and the thickness of the core layer is 30 nm or less, the reflectance is 0.04% or less.

Third Experimental Example

FIG. 9 is a graph showing transmittance and reflectance of a pellicle according to the third experimental example.

Referring to FIG. 9, the pellicle layer of the pellicle according to the third experimental example includes the support layer, the core layer, and the capping layer. The materials of the support layer and the capping layer are SiN$_x$. The material of the core layer is amorphous carbon, and the density of the amorphous carbon is 1.8 g/cm$^3$.

The pellicle layer according to the third experimental example is expressed as "SiN_C(0 nm)_C_SiN(5 nm)_density 1.8". Here, 'SiN' is the capping layer, 'C' is the core layer, and 'SiN(5 nm)' is the support layer. Also, 'density 1.8' is the density of amorphous carbon.

When the thickness of the capping layer is 10 nm or less and the thickness of the core layer is 24 nm or less, the transmittance is 85% or more. When the thickness of the capping layer is 10 nm or less and the thickness of the core layer is 14 nm or less, the transmittance is 90% or more.

In addition, when the thickness of the capping layer is 2 to 4 nm or 8 to 10 nm and the thickness of the core layer is 30 nm or less, the reflectance is 0.04% or less.

As such, according to the first to third experimental examples, when the core layer is an amorphous carbon layer, and when the thickness of the core layer is formed to be 30 nm or less, the pellicle having an extreme ultraviolet transmittance of 90% or more and a reflectance of 0.04% or less can be provided.

Fourth to Sixth Experimental Examples

FIGS. 10 to 15 are graphs showing transmittance and reflectance of pellicles for extreme ultraviolet lithography according to fourth to sixth experimental examples in which a buffer layer is an amorphous carbon layer.

Fourth Experimental Example

Figure 10:
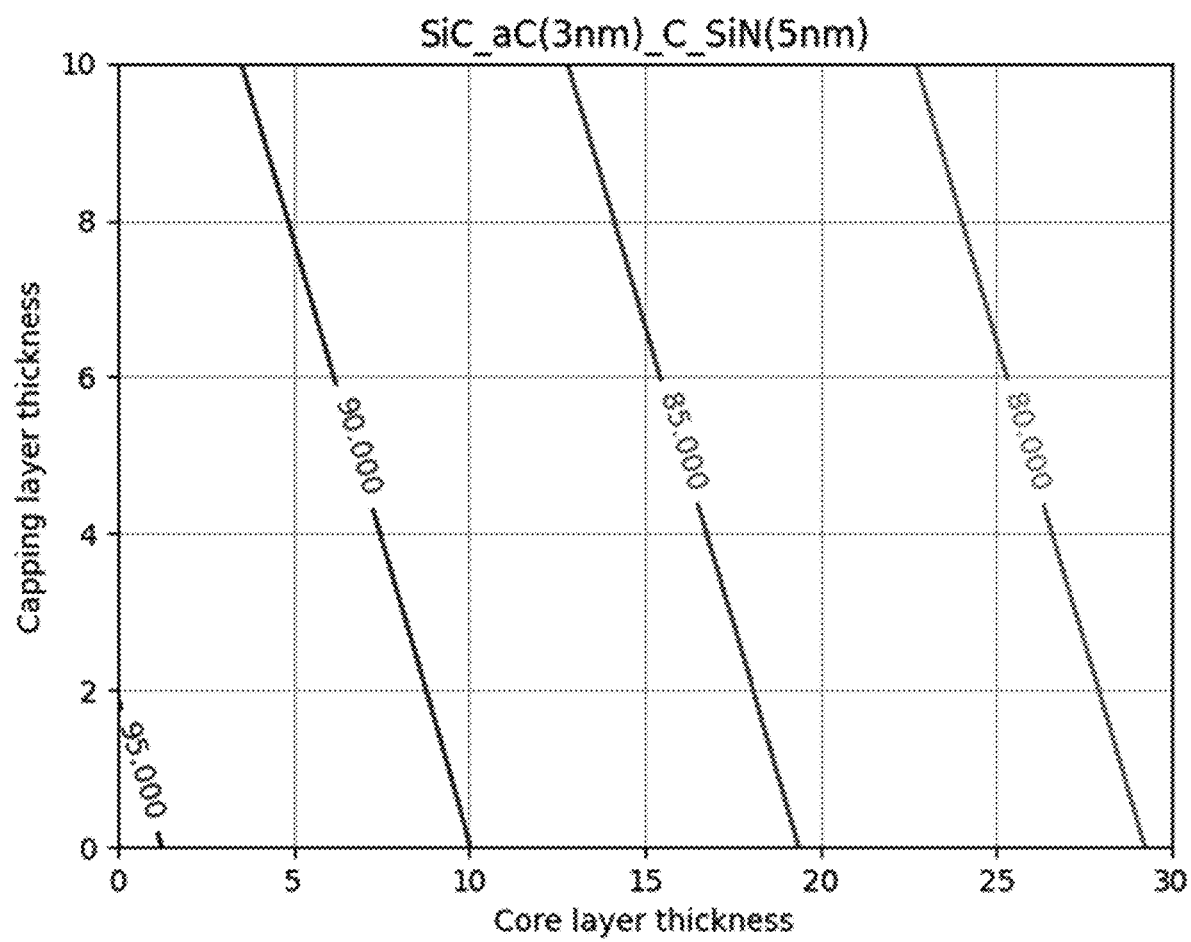
FIGS. 10 to 15 are graphs showing transmittance and reflectance of pellicles for extreme ultraviolet lithography according to fourth to sixth experimental examples in which a buffer layer is an amorphous carbon layer.
Figure 11:
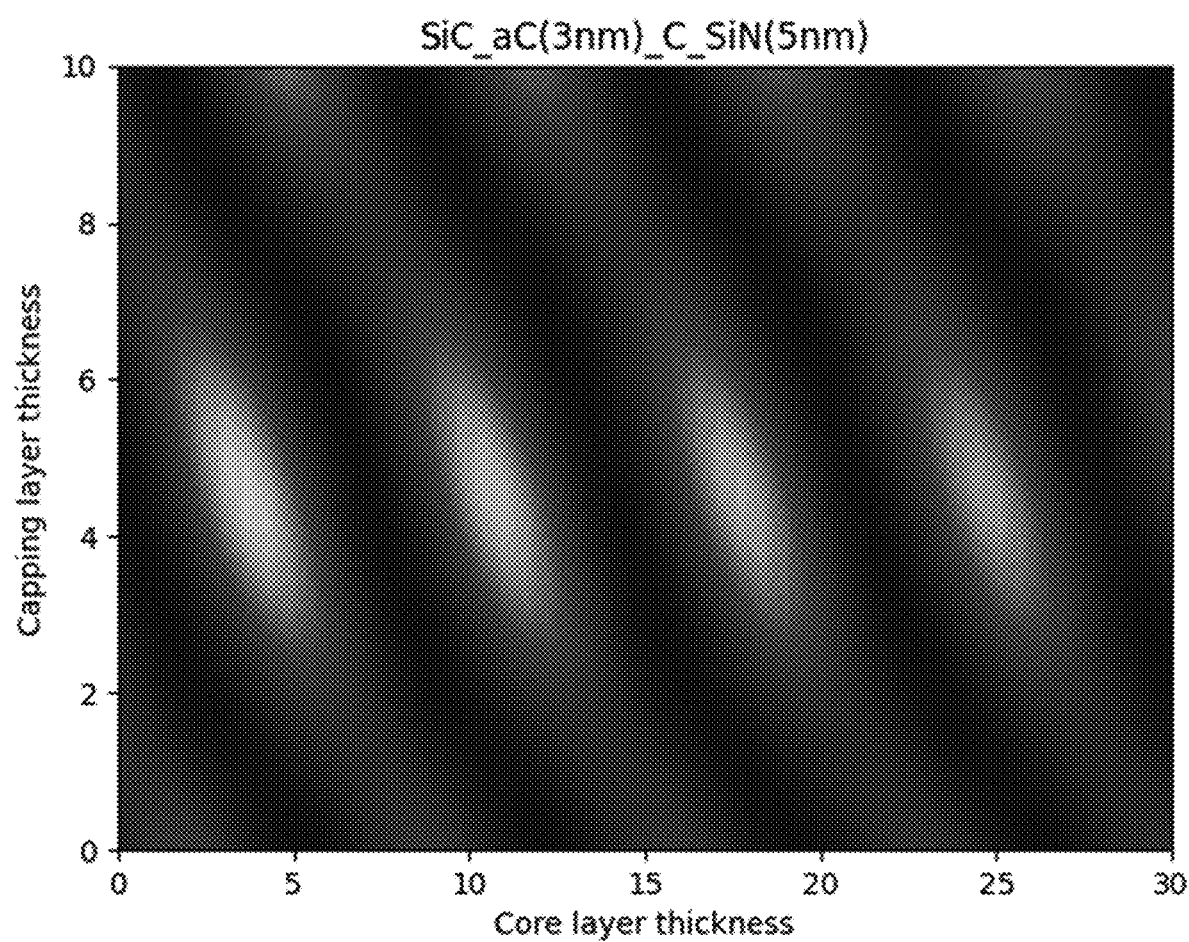

FIG. 10 is a graph showing transmittance of a pellicle according to the fourth experimental example. FIG. 11 is a graph showing reflectance of a pellicle according to the fourth experimental example.

Referring to FIGS. 10 and 11, the pellicle layer of the pellicle according to the fourth experimental example includes the support layer, the core layer, the buffer layer, and the capping layer. The support layer is made of $SiN_x$ material and has a thickness of 5 nm. The core layer is graphene. The buffer layer is made of amorphous carbon and has a thickness of 3 nm. The material of the capping layer is SiC.

The pellicle layer according to the fourth experimental example is expressed as "SiC_aC(3 nm)_C_SiN(5 nm)". Here, 'SiC' is the capping layer, 'aC(3 nm)' is the buffer layer, 'C' is the core layer, and 'SiN(5 nm)' is the support layer.

When the thickness of the capping layer is 10 nm or less and the thickness of the core layer is 19 nm or less, the transmittance is 85% or more. When the thickness of the capping layer is 10 nm or less and the thickness of the core layer is 10 nm or less, the transmittance is 90% or more.

In addition, when the thickness of the capping layer is 1 to 3 nm or 7 to 9 nm and the thickness of the core layer is 30 nm or less, the reflectance is 0.04% or less.

Fifth Experimental Example

Figure 12:
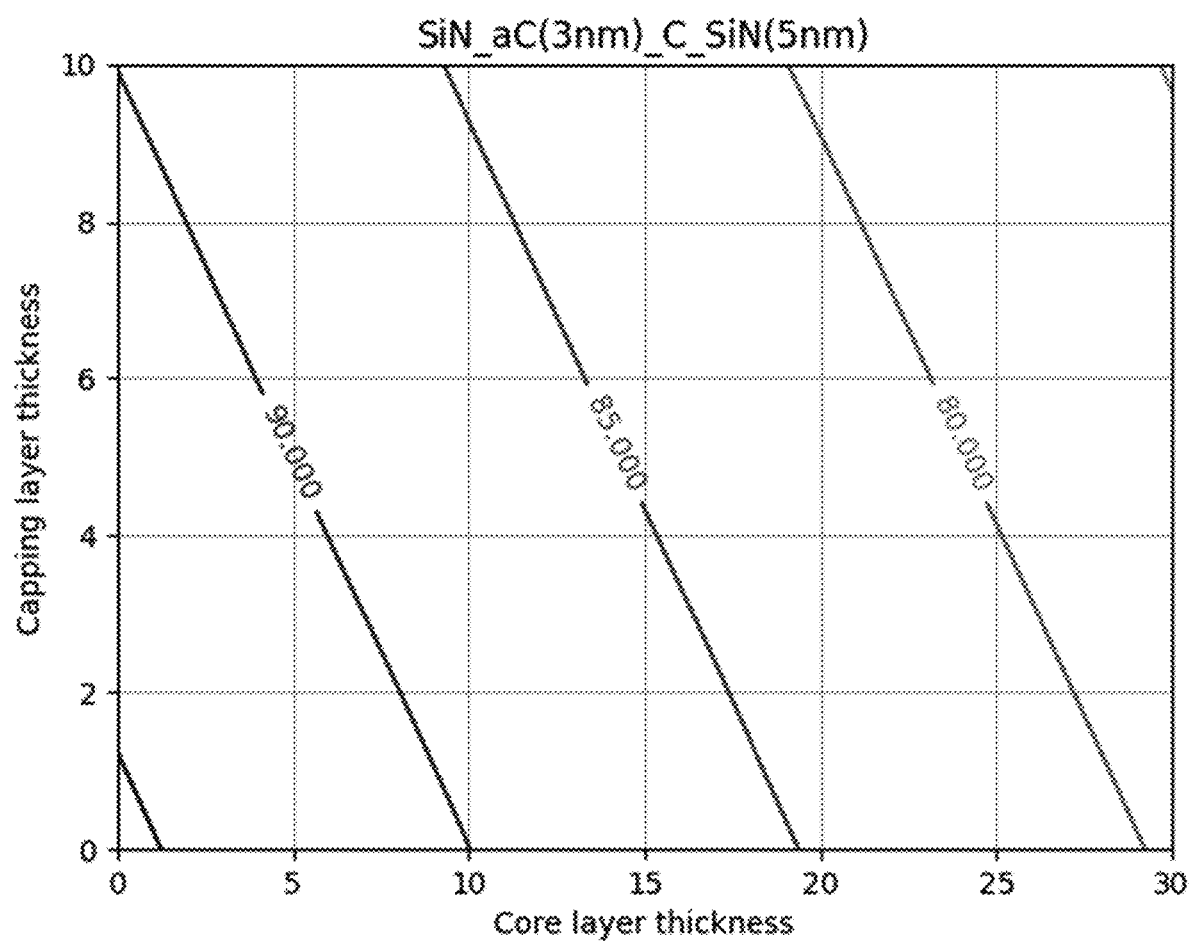
Figure 13:
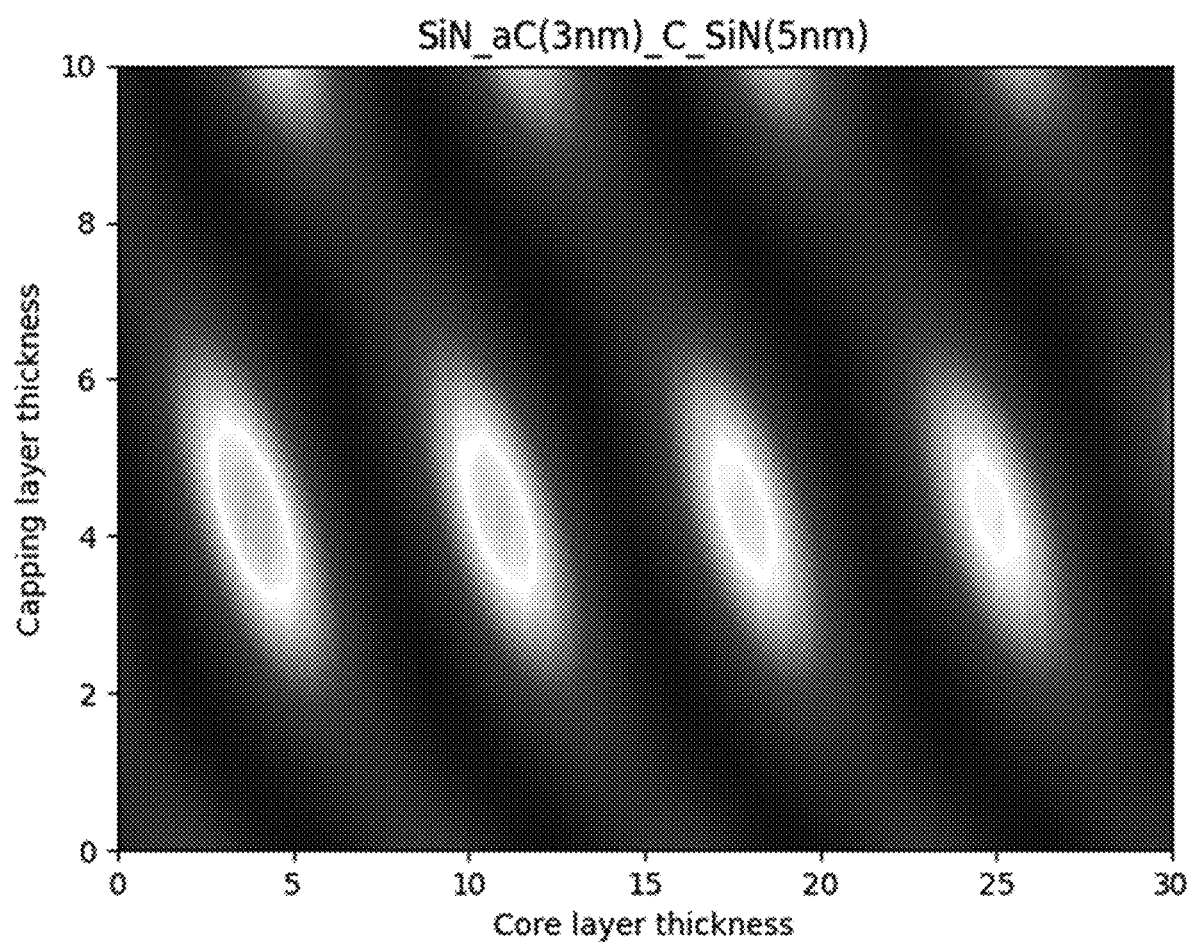

FIG. 12 is a graph showing transmittance of a pellicle according to the fifth experimental example. FIG. 13 is a graph showing reflectance of a pellicle according to the fifth experimental example.

Referring to FIGS. 12 and 13, the pellicle layer of the pellicle according to the fifth experimental example includes the support layer, the core layer, the buffer layer, and the capping layer. The support layer is made of $SiN_x$ material and has a thickness of 5 nm. The core layer is graphene. The buffer layer is made of amorphous carbon and has a thickness of 3 nm. The material of the capping layer is $SiN_x$.

The pellicle layer according to the fifth experimental example is expressed as "SiN_aC(3 nm)_C_SiN(5 nm)". Here, 'SiN' is the capping layer, 'aC(3 nm)' is the buffer layer, 'C' is the core layer, and 'SiN(5 nm)' is the support layer.

When the thickness of the capping layer is 10 nm or less and the thickness of the core layer is 19 nm or less, the transmittance is 85% or more. When the thickness of the capping layer is 10 nm or less and the thickness of the core layer is 10 nm or less, the transmittance is 90% or more.

In addition, when the thickness of the capping layer is 1 to 2 nm or 7 to 9 nm and the thickness of the core layer is 30 nm or less, the reflectance is 0.04% or less.

Sixth Experimental Example

Figure 14:
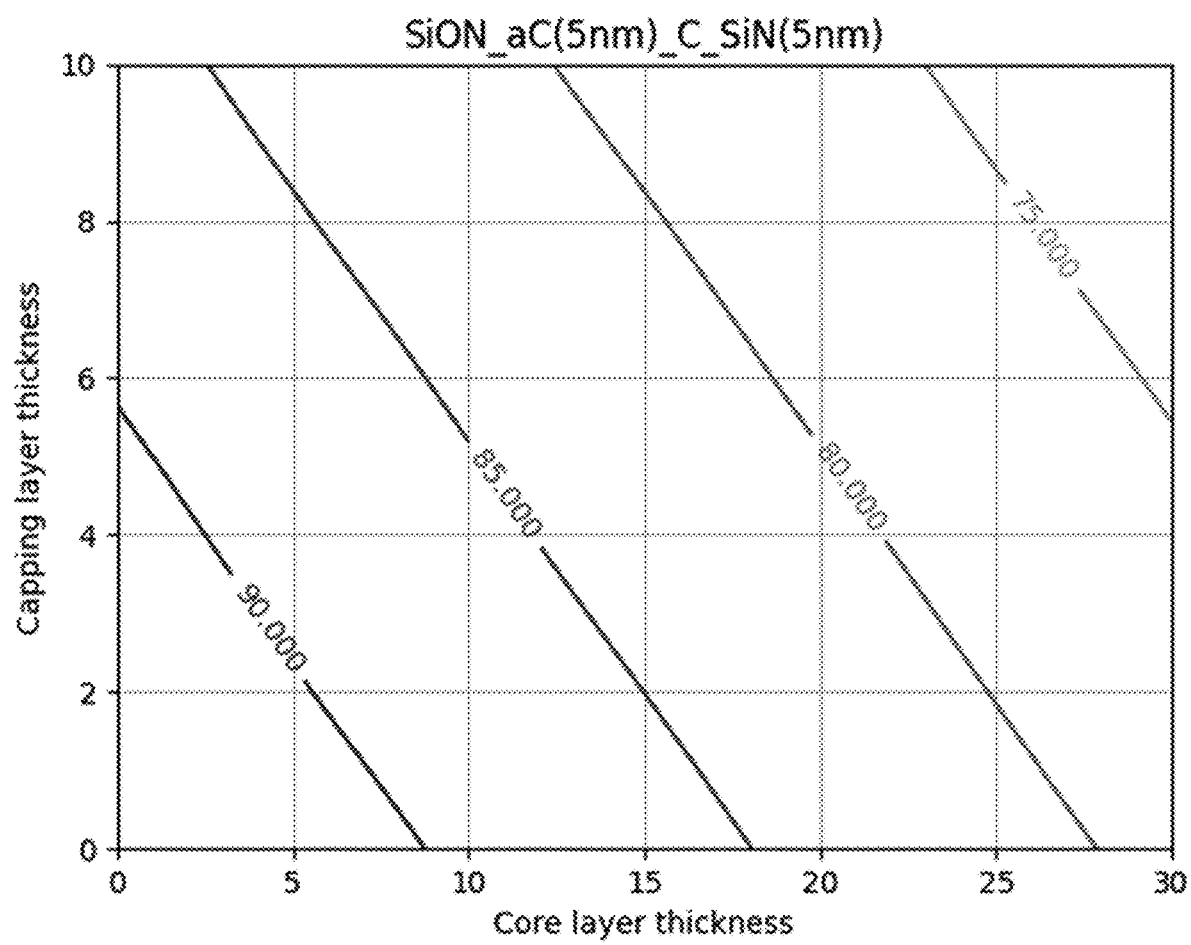
Figure 15:
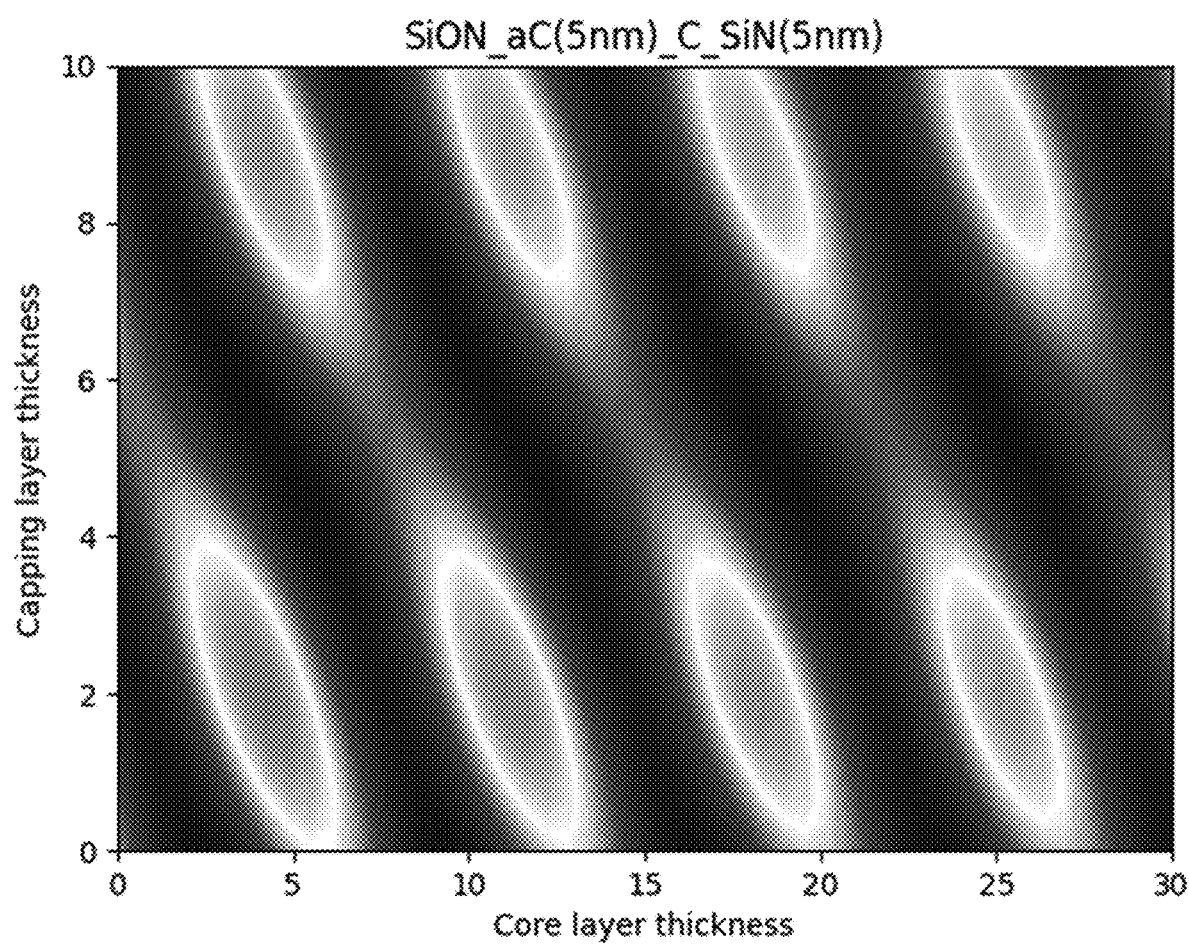

FIG. 14 is a graph showing transmittance of a pellicle according to the sixth experimental example. FIG. 15 is a graph showing reflectance of a pellicle according to the sixth experimental example.

Referring to FIGS. 14 and 15, the pellicle layer of the pellicle according to the sixth experimental example includes the support layer, the core layer, the buffer layer, and the capping layer. The support layer is made of $SiN_x$ material and has a thickness of 5 nm. The core layer is graphene. The buffer layer is made of amorphous carbon and has a thickness of 5 nm. The material of the capping layer is SiON.

The pellicle layer according to the sixth experimental example is expressed as "SiON_aC(5 nm)_C_SiN(5 nm)". Here, 'SiON' is the capping layer, 'aC(5 nm)' is the buffer layer, 'C' is the core layer, and 'SiN(5 nm)' is the support layer.

When the thickness of the capping layer is 10 nm or less and the thickness of the core layer is 18 nm or less, the transmittance is 85% or more. When the thickness of the capping layer is 6 nm or less and the thickness of the core layer is 8 nm or less, the transmittance is 90% or more.

In addition, when the thickness of the capping layer is 4 to 7 nm and the thickness of the core layer is 30 nm or less, the reflectance is 0.04% or less.

As such, according to the fourth to sixth experimental examples, when the thickness of the core layer made of graphene is 10 to 15 nm, and when the buffer layer is formed of an amorphous carbon layer of 7 nm or less, it is possible to provide the pellicle having an extreme ultraviolet transmittance of 90% or more and a reflectance of 0.04% or less even though the capping layer having a wide thickness range of 10 nm or less is formed.

Seventh to Ninth Experimental Examples

FIGS. 16 to 21 are graphs showing transmittance and reflectance of pellicles for extreme ultraviolet lithography according to seventh to ninth experimental examples in which a capping layer is an amorphous carbon layer.

Seventh Experimental Example

Figure 16:
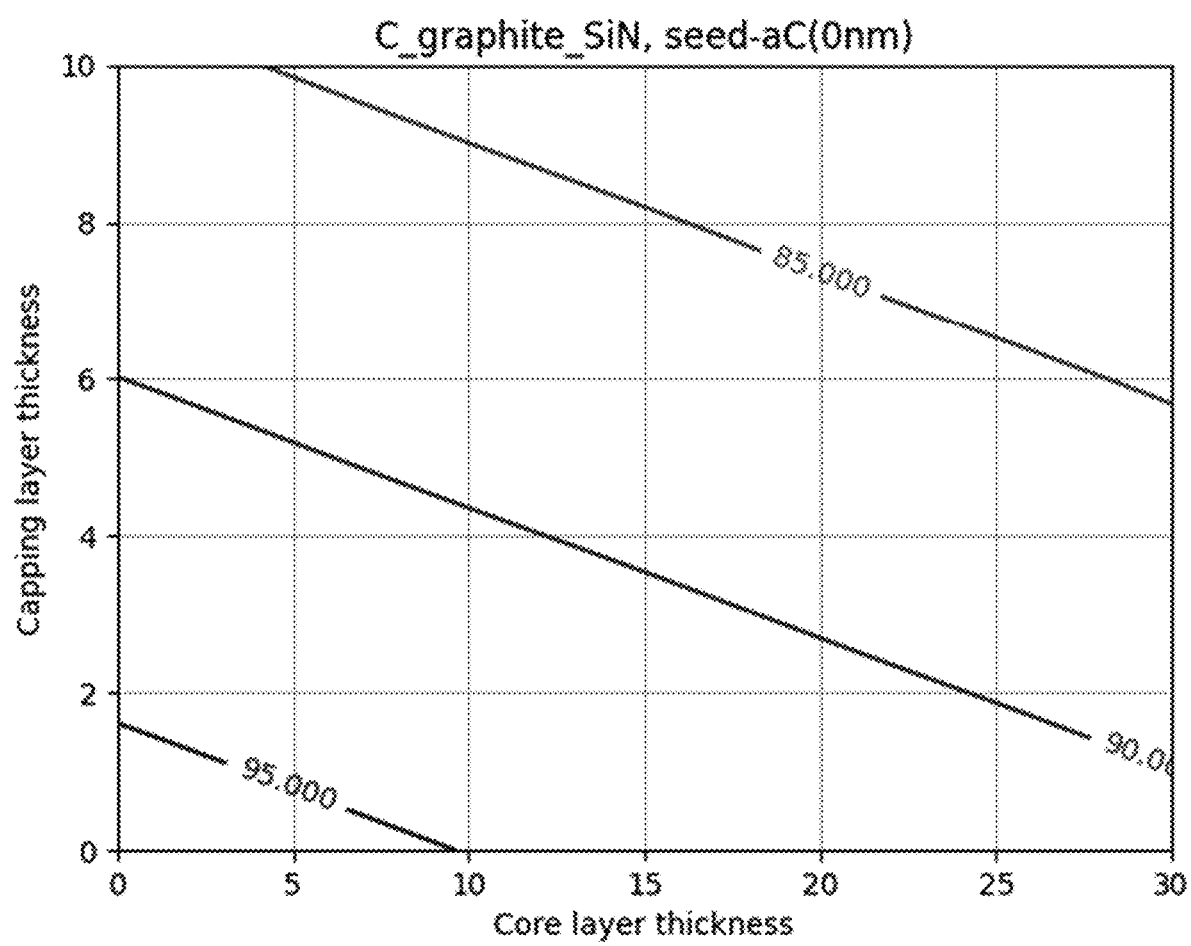
FIGS. 16 to 21 are graphs showing transmittance and reflectance of pellicles for extreme ultraviolet lithography according to seventh to ninth experimental examples in which a capping layer is an amorphous carbon layer.
Figure 17:
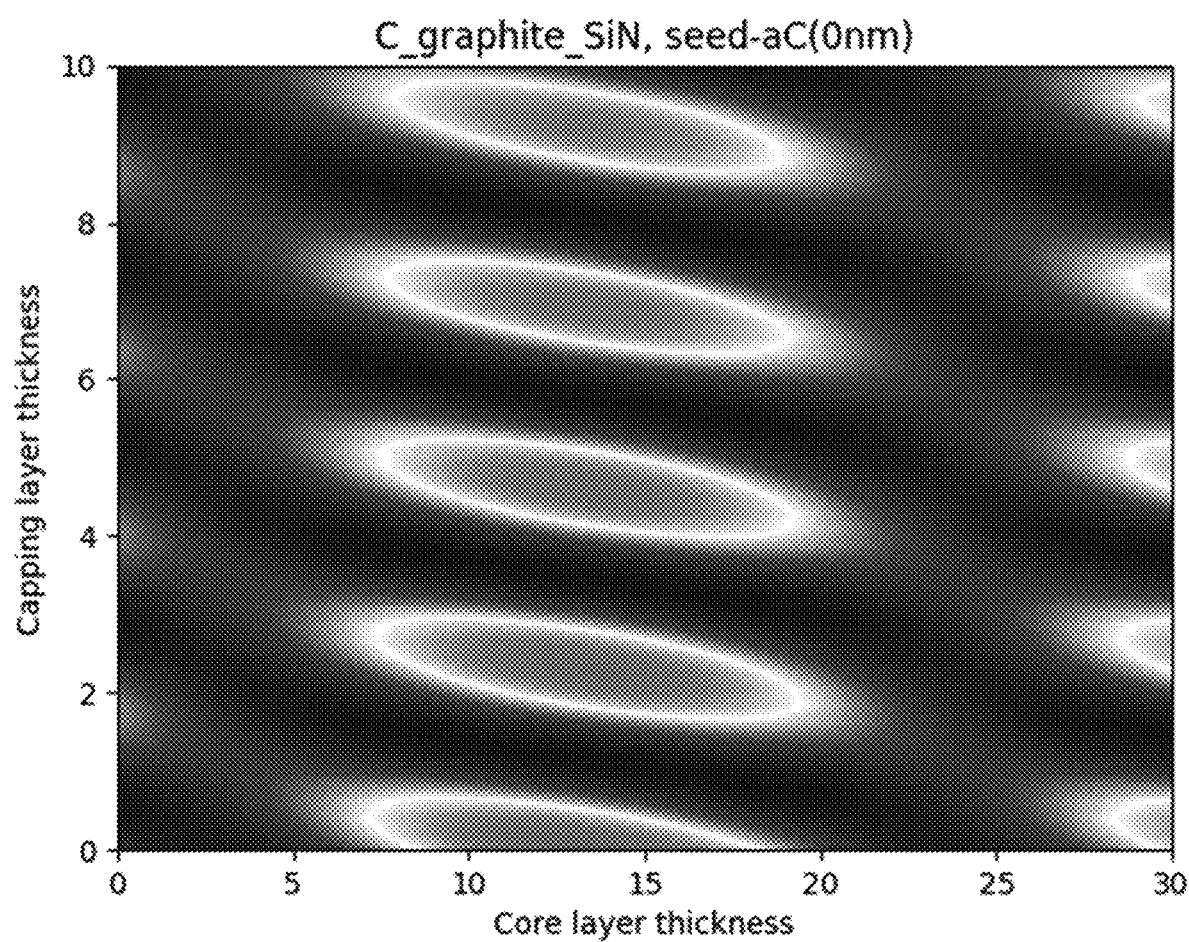

FIG. 16 is a graph showing transmittance of a pellicle according to the seventh experimental example. FIG. 17 is a graph showing reflectance of a pellicle according to the seventh experimental example.

Referring to FIGS. 16 and 17, the pellicle layer of the pellicle according to the seventh experimental example includes the support layer, the core layer, and the capping layer. The support layer is made of $SiN_x$ material and has a thickness of 5 nm. The core layer is graphene. The material of the capping layer is amorphous carbon.

The pellicle layer according to the seventh experimental example is expressed as "C_graphite_SiN, seed-aC(0 nm)". Here, 'C' is the capping layer, 'graphite' is the core layer, and 'SiN' is the support layer. Also, 'seed-aC(0 nm)' means that the core layer of a graphene material is formed using interlayer exchange between a metal catalyst layer formed on the support layer without a seed layer and a source layer made of an amorphous carbon material.

When the thickness of the capping layer is 10 nm or less and the thickness of the core layer is 30 nm or less, the transmittance is 85% or more. When the thickness of the capping layer is 6 nm or less and the thickness of the core layer is 30 nm or less, the transmittance is 90% or more.

In addition, when the thickness of the capping layer is 1 to 10 nm and the thickness of the core layer is 1 to 5 nm or 22 to 25 nm, the reflectance is 0.04% or less.

Eighth Experimental Example

Figure 18:
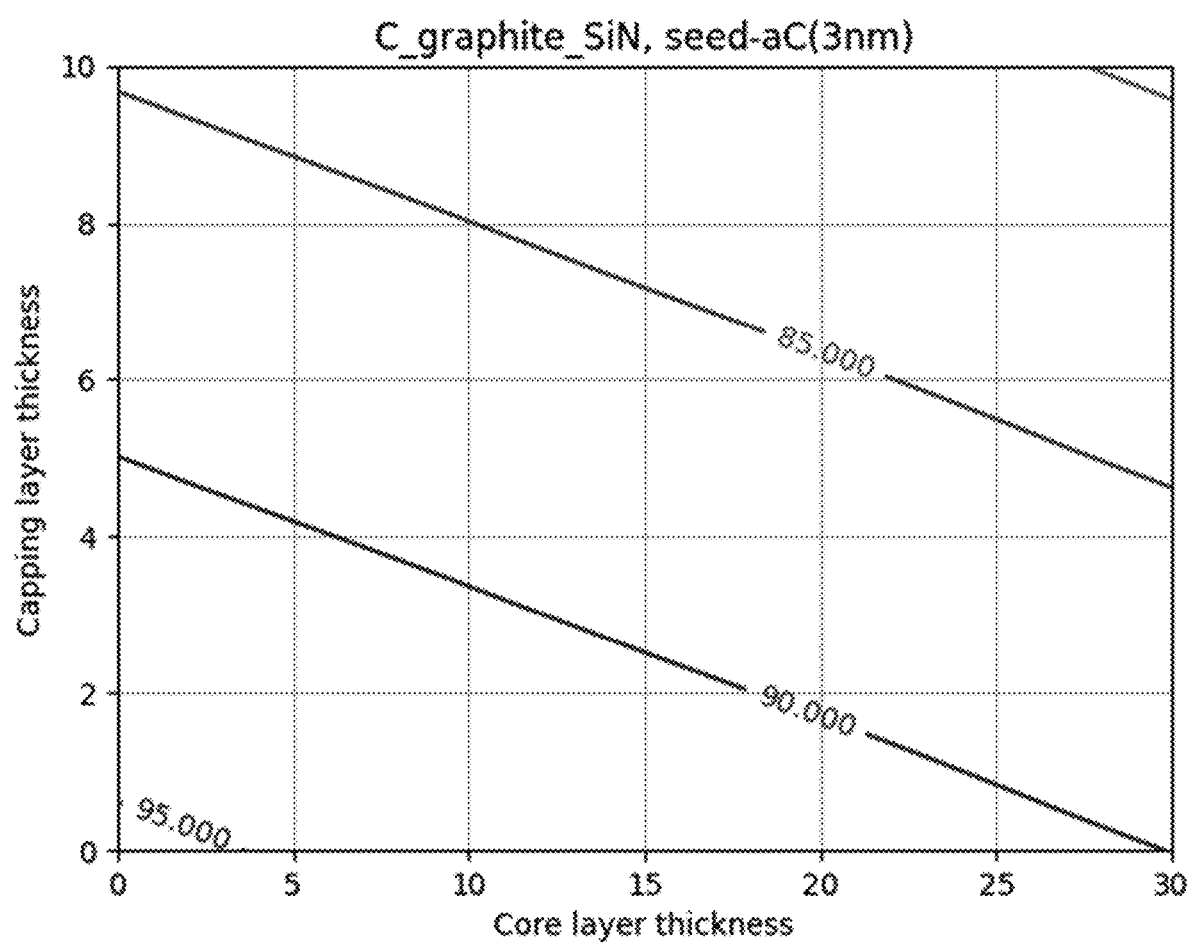
Figure 19:
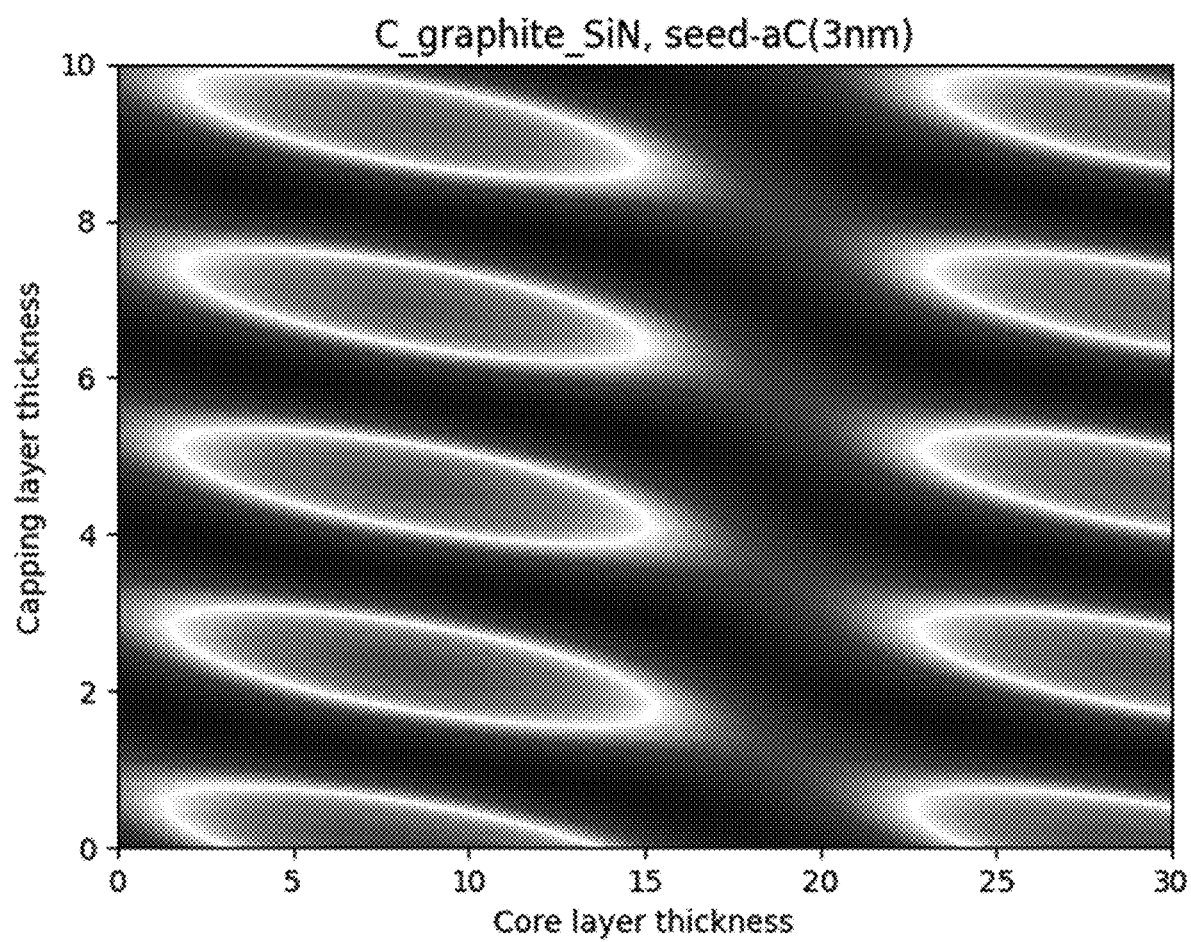

FIG. 18 is a graph showing transmittance of a pellicle according to the eighth experimental example. FIG. 19 is a graph showing reflectance of a pellicle according to the eighth experimental example.

Referring to FIGS. 18 and 19, the pellicle layer of the pellicle according to the eighth experimental example includes the support layer, the core layer, and the capping layer. The support layer is made of $SiN_x$ material and has a thickness of 5 nm. The core layer is graphene. The material of the capping layer is amorphous carbon.

The pellicle layer according to the eighth experimental example is expressed as "C_graphite_SiN, seed-aC(3 nm)". Here, 'C' is the capping layer, 'graphite' is the core layer, and 'SiN' is the support layer. Also, 'seed-aC(3 nm)' means that, based on a seed layer made of a 3 nm thick amorphous carbon material formed on the support layer, the core layer of a graphene material is formed on the seed layer using interlayer exchange between a metal catalyst layer formed on the seed layer and a source layer made of an amorphous carbon material.

When the thickness of the capping layer is 9 nm or less and the thickness of the core layer is 30 nm or less, the transmittance is 85% or more. When the thickness of the capping layer is 5 nm or less and the thickness of the core layer is 29 nm or less, the transmittance is 90% or more.

In addition, when the thickness of the capping layer is 1 to 10 nm and the thickness of the core layer is 17 to 20 nm, the reflectance is 0.04% or less.

Ninth Experimental Example

Figure 20:
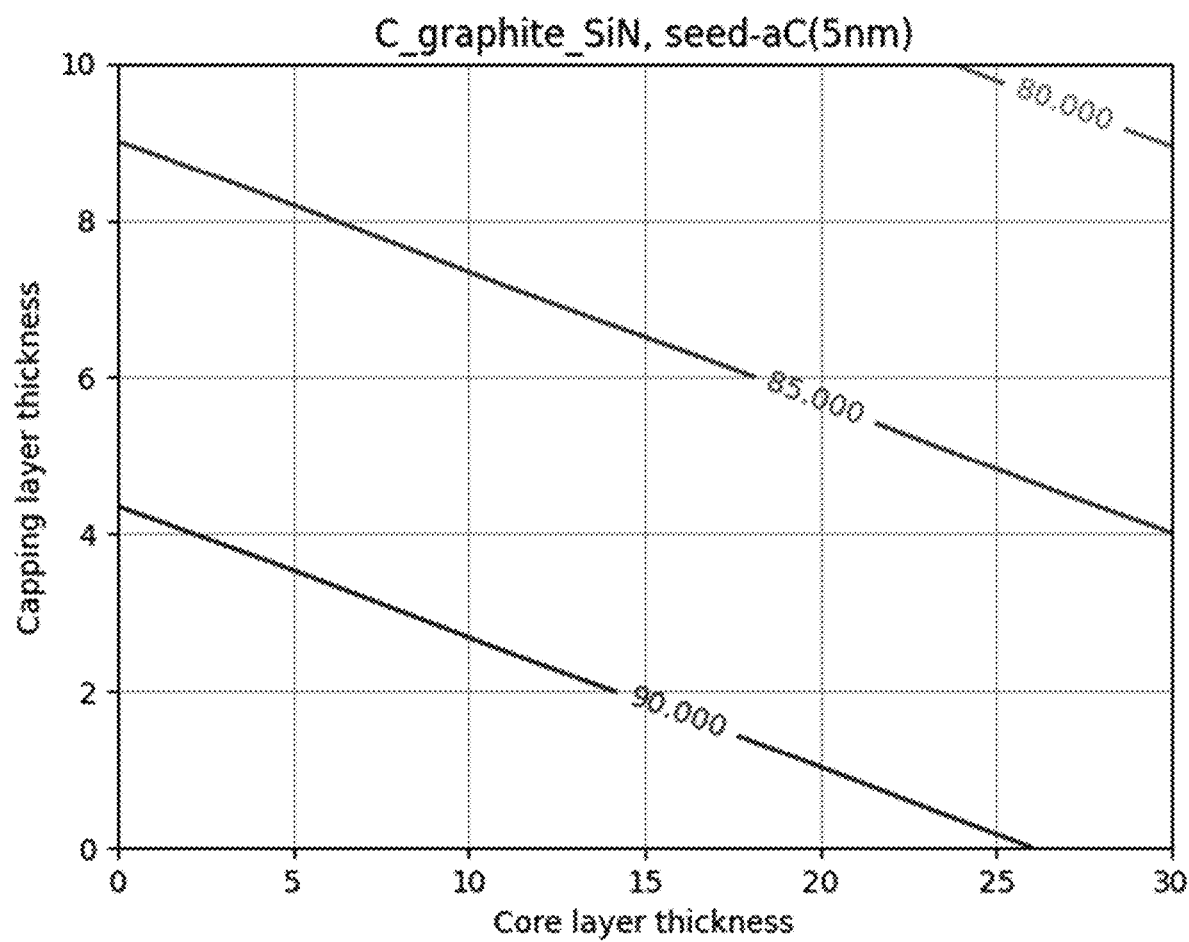
Figure 21:
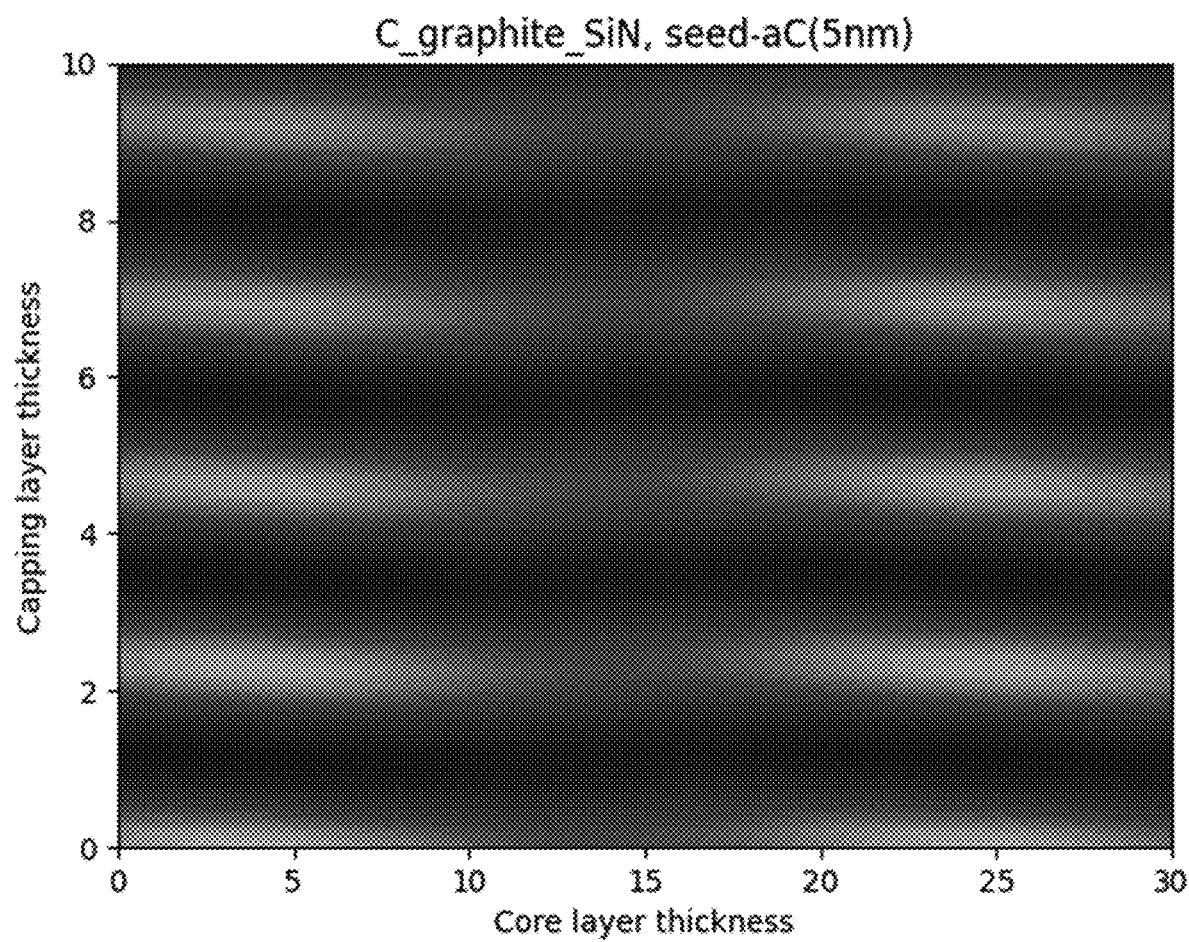

FIG. 20 is a graph showing transmittance of a pellicle according to the ninth experimental example. FIG. 21 is a graph showing reflectance of a pellicle according to the ninth experimental example.

Referring to FIGS. 20 and 21, the pellicle layer of the pellicle according to the ninth experimental example includes the support layer, the core layer, and the capping layer. The support layer is made of $SiN_x$ material and has a thickness of 5 nm. The core layer is graphene. The material of the capping layer is amorphous carbon.

The pellicle layer according to the ninth experimental example is expressed as "C_graphite_SiN, seed-aC(5 nm)". Here, 'C' is the capping layer, 'graphite' is the core layer, and 'SiN' is the support layer. Also, 'seed-aC(5 nm)' means that, based on a seed layer made of a 5 nm thick amorphous carbon material formed on the support layer, the core layer of a graphene material is formed on the seed layer using interlayer exchange between a metal catalyst layer formed on the seed layer and a source layer made of an amorphous carbon material.

When the thickness of the capping layer is 9 nm or less and the thickness of the core layer is 30 nm or less, the transmittance is 85% or more. When the thickness of the capping layer is 5 nm or less and the thickness of the core layer is 26 nm or less, the transmittance is 90% or more.

In addition, when the thickness of the capping layer is 10 nm or less and the thickness of the core layer is 30 nm or less, the reflectance is 0.05% or less. When the thickness of the capping layer is 3 to 4 nm, 5 to 6 nm, 7 to 9 nm, or about 10 nm and the thickness of the core layer is 30 nm or less, the reflectance is 0.04% or less.

As such, according to the seventh to ninth experimental examples, when the capping layer is an amorphous carbon layer, and when the thickness of the core layer is formed to be 30 nm or less, the pellicle having an extreme ultraviolet transmittance of 90% or more and a reflectance of 0.04% or less can be provided.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:
1. A pellicle for extreme ultraviolet lithography, the pellicle comprising:
   a substrate having an opening formed in a central portion;
   a support layer formed on the substrate to cover the opening; and
   a pellicle layer formed on the support layer and containing amorphous carbon,
   the pellicle layer including:
   a core layer formed on the support layer; and
   a capping layer formed on the core layer and containing the amorphous carbon.
2. The pellicle of claim 1, wherein, when the capping layer is an amorphous carbon layer, a thickness is 10 nm or less.
3. The pellicle of claim 2, wherein the core layer includes at least one of graphene, Me-α (Me is at least one of Zr or Mo, and α is at least one of nitride, boride, carbide, or silicide), $ZrSi_2$, $ZrB_x$ (2≤x<16), $ZrB_xSi_y$ (x≥2, y≥2), or $YB_x$ (x≥2).
4. The pellicle of claim 1, wherein the core layer contains the amorphous carbon.
5. The pellicle of claim 4, wherein, when the core layer is an amorphous carbon layer, a thickness is 30 nm or less.
6. The pellicle of claim 1, wherein the pellicle layer further includes a buffer layer formed at least one of between the support layer and the core layer, or between the core layer and the capping layer.
7. The pellicle of claim 6, wherein the buffer layer contains the amorphous carbon.
8. The pellicle of claim 7, wherein a thickness of the buffer layer is 7 nm or less.
9. The pellicle of claim 8, wherein the core layer includes at least one of graphene, Me-α (Me is at least one of Zr or Mo, and a is at least one of nitride, boride, carbide, or silicide), $ZrSi_2$, $ZrB_x$ (2≤x<16), $ZrB_xSi_y$ (x≥2, y≥2), or $YB_x$ (x≥2).
10. The pellicle of claim 1, wherein a density of the amorphous carbon is 1.4 $g/cm^3$ to 1.8 $g/cm^3$.
11. A method for manufacturing a pellicle for extreme ultraviolet lithography, the method comprising:
   forming a support layer on a substrate;
   forming a pellicle layer containing amorphous carbon on the support layer; and
   forming an opening by removing a central portion of the substrate under the support layer to expose the support layer,
   wherein forming the pellicle layer includes:
   forming a core layer on the support layer; and
   forming a capping layer containing the amorphous carbon on the core layer.
12. The method of claim 11, wherein forming the pellicle layer further includes:
   forming a buffer layer containing the amorphous carbon on the core layer before forming the capping layer on the core layer.
13. The method of claim 11, wherein forming the pellicle layer further includes:
   forming a first buffer layer on the support layer before forming the core layer on the support layer; and forming a second buffer layer on the core layer before forming the capping layer on the core layer.

14. The method of claim 13, wherein at least one of the first buffer layer or the second buffer layer contains the amorphous carbon.

\* \* \* \* \*